United States Patent
Motosugi et al.

(10) Patent No.: US 9,147,552 B2
(45) Date of Patent: Sep. 29, 2015

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventors: Tomoo Motosugi, Kanagawa (JP); Hirohito Anze, Kanagawa (JP); Satoshi Nakahashi, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/446,899

(22) Filed: Jul. 30, 2014

(65) Prior Publication Data
US 2015/0041671 A1    Feb. 12, 2015

(30) Foreign Application Priority Data
Aug. 9, 2013  (JP) ................. 2013-165885

(51) Int. Cl.
  *G21K 5/10*    (2006.01)
  *H01J 37/147*  (2006.01)
  *H01J 37/302*  (2006.01)
  *H01J 37/317*  (2006.01)

(52) U.S. Cl.
  CPC ......... *H01J 37/3026* (2013.01); *H01J 37/3174* (2013.01); *H01J 2237/31764* (2013.01)

(58) Field of Classification Search
  USPC ............ 250/396 R, 397, 491.1, 492.1, 492.2, 250/492.22, 492.3
  See application file for complete search history.

(56) References Cited

U.S. PATENT DOCUMENTS

| | | | |
|---|---|---|---|
| 6,717,160 B2 | 4/2004 | Nakai et al. | |
| 7,655,904 B2* | 2/2010 | Yamashita | 250/306 |
| 8,309,283 B2* | 11/2012 | Kato et al. | 430/30 |
| 8,803,108 B2* | 8/2014 | Nishimura | 250/491.1 |
| 8,872,139 B2* | 10/2014 | Nishimura et al. | 250/492.22 |
| 2003/0160191 A1 | 8/2003 | Nakai et al. | |
| 2008/0036899 A1* | 2/2008 | Yamashita | 348/340 |

(Continued)

FOREIGN PATENT DOCUMENTS

| | | |
|---|---|---|
| JP | 2003-249428 | 9/2003 |
| JP | 2003-309062 | 10/2003 |

OTHER PUBLICATIONS

Sukjong Bae, et al., "Deflector Contamination in E-beam Mask Writer and Its Effect on Pattern Placement Error of Photomask for Sub 20nm Device Node", Proc. Of SPIE, vol. 8441, 8441C-2, 2012, 8 pages.

*Primary Examiner* — Bernard E Souw
(74) *Attorney, Agent, or Firm* — Oblon, McClelland, Maier & Neustadt, L.L.P.

(57) ABSTRACT

A charged particle beam writing method includes determining whether a difference between one of the total area of a pattern and the number of shots in a stripe region with respect to one of adjacent stripe regions of the stripe regions and one of the total area and the number of shots with respect to the other of the adjacent stripe regions exceeds a threshold value, re-dividing, when the difference exceeds the threshold value, a stripe region where the total area or the number of shots is larger than that of the other stripe region in the adjacent stripe regions so that the difference of the total area or the number of shots becomes lower than or equal to the threshold value, and writing a pattern in the stripe regions including a re-divided stripe region, in the writing order of arrangement of the stripe regions.

18 Claims, 21 Drawing Sheets

(56) References Cited

U.S. PATENT DOCUMENTS

| | | | |
|---|---|---|---|
| 2010/0173235 A1* | 7/2010 | Kato et al. | 430/30 |
| 2011/0255770 A1* | 10/2011 | Touya et al. | 382/144 |
| 2013/0216120 A1* | 8/2013 | Inoue et al. | 382/144 |
| 2013/0250095 A1* | 9/2013 | Inoue et al. | 348/94 |
| 2014/0054469 A1* | 2/2014 | Nishimura | 250/400 |
| 2014/0284500 A1* | 9/2014 | Nishimura et al. | 250/492.2 |

* cited by examiner

Temporal Sequence of Position Measurement Result and Number of Shots per Stripe

Large Position Deviation Occurs at Timing of Number of Shots Changing Greatly

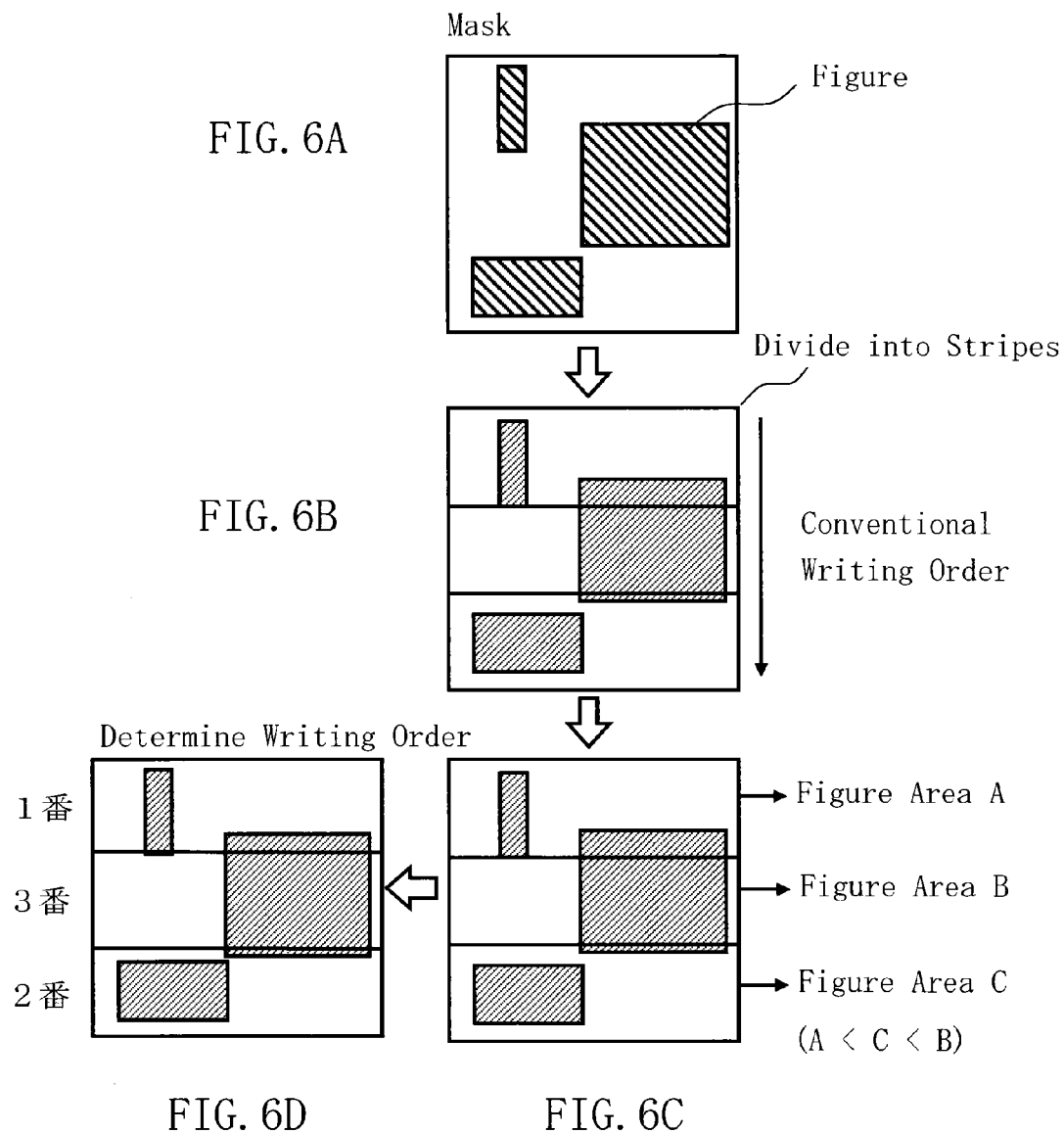

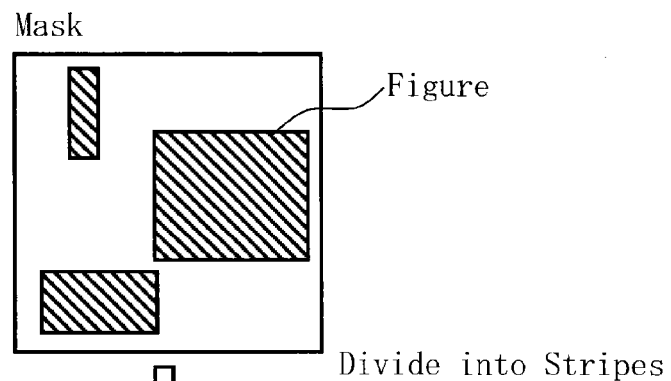
FIG. 10A  Mask, Figure
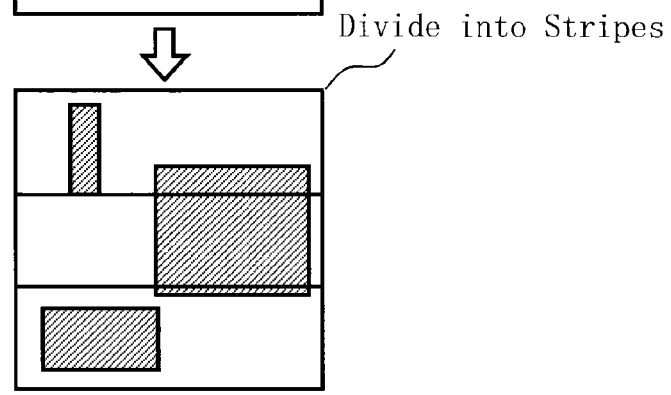
FIG. 10B  Divide into Stripes
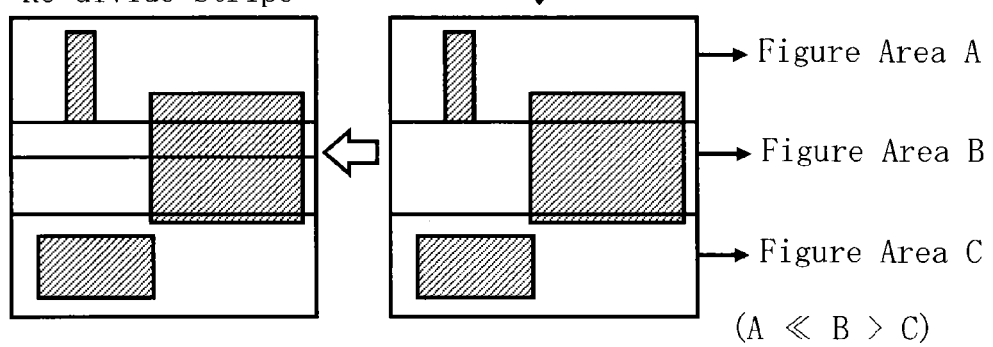
FIG. 10D  Re-divide Stripe
FIG. 10C  → Figure Area A, → Figure Area B, → Figure Area C  (A ≪ B > C)

| Area Comparison Stripe | Exceeding Area Difference Acceptable Value? |
|---|---|
| A and B | No |
| B and C | Yes |
| C and D | No |
| D and E | No |

Area Difference Acceptable Value T : T
Set Area Difference t to be Set for Dividing Stripe : t (0 < t' ≦ T)

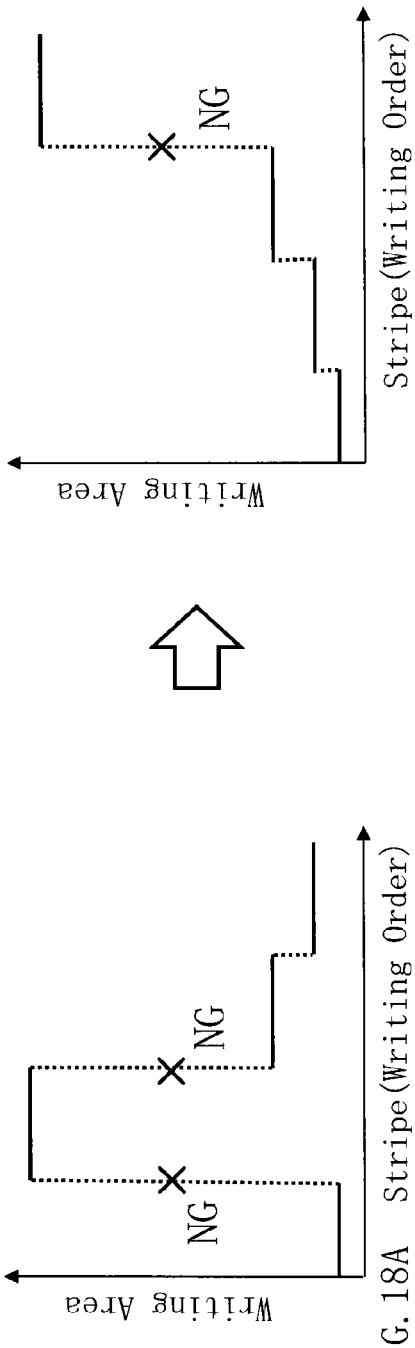
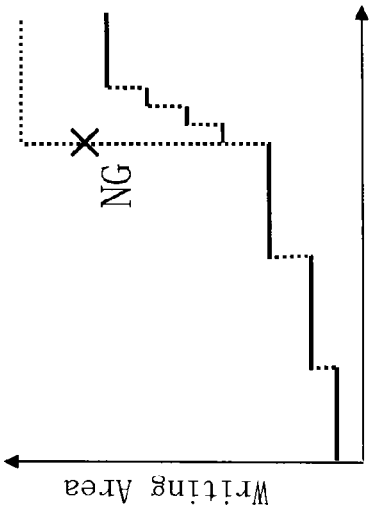
FIG. 18A Conventional Writing Order and Area
FIG. 18B After Rearranging Writing Order
FIG. 18C After Re-division of Stripe After Rearranging Writing Order Conventional Writing Order and Area

CHARGED PARTICLE BEAM WRITING METHOD AND CHARGED PARTICLE BEAM WRITING APPARATUS

CROSS-REFERENCE TO RELATED APPLICATION

This application is based upon and claims the benefit of priority from the prior Japanese Patent Application No. 2013-165885 filed on Aug. 9, 2013 in Japan, the entire contents of which are incorporated herein by reference.

BACKGROUND OF THE INVENTION

1. Field of the Invention

The present invention relates to a charged particle beam writing method and a charged particle beam writing apparatus. More specifically, for example, the present invention relates to a method for increasing the accuracy of the writing position of the electron beam writing apparatus.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 22 is a conceptual diagram explaining operations of a variable shaping type electron beam writing or "drawing" apparatus. The variable shaping electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during the writing. In other words, a quadrangular shape that can pass through both the aperture 411 and the variable shape aperture 421 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In electron beam writing, there is a problem in that if a pattern density greatly varies during writing, the position accuracy of a pattern is degraded at the place of varying. As a cause of this problem, for example, charging of an extraneous matter adhered to the deflector is described (refer to, e.g., "Proc. of SPIE Vol. 8441 84410C-2"). Then, as a solution to this problem, it has been attempted to improve the decrease of the position accuracy by setting the stripe width to be small in order to lessen the writing area per stripe. However, if the stripe width is set to be narrow, there occurs a problem in that the throughput is reduced because the number of stripes set in the target object is greatly increased. Therefore, this method is not desirable. Accordingly, conventionally, the problem described above has been coped with by periodically measuring a beam drift amount to correct the beam drift. However, with respect to the place where the pattern density sharply changes, drift correction has difficulty in following the beam position variation. Therefore, required position accuracy has not been obtained. Although it is necessary to set the time interval to measure a beam drift amount to be very short for dealing with even the case of the sharp variation of a pattern density, the writing operation needs to be stopped when measuring the beam drift amount, which poses a problem of throughput decrease. Therefore, this method is not desirable, either.

BRIEF SUMMARY OF THE INVENTION

In accordance with one aspect of the present invention, a charged particle beam writing method includes virtually dividing a writing region of a target object into a plurality of strip-shaped stripe regions, calculating one of a total area of a pattern assigned to a stripe region concerned and a number of shots of a charged particle beam for writing the pattern assigned to the stripe region concerned, for each stripe region of the plurality of stripe regions, determining whether a difference between the one of the total area of the pattern and the number of shots with respect to one of adjacent stripe regions of the plurality of stripe regions and the one of the total area of the pattern and the number of shots with respect to an other of the adjacent stripe regions exceeds a corresponding threshold value, re-dividing, in a case where the difference exceeds the corresponding threshold value as a result of the determining, a stripe region whose one of the total area of the pattern and the number of shots is larger than that of an other stripe region in the adjacent stripe regions so that the difference of the one of the total area of the pattern and the number of shots becomes lower than or equal to the corresponding threshold value and writing a pattern, with a charged particle beam, in the plurality of stripe regions including the stripe region having been re-divided, in a writing order of arrangement of the plurality of stripe regions.

In accordance with another aspect of the present invention, a charged particle beam writing method includes virtually dividing a writing region of a target object into a plurality of strip-shaped stripe regions, calculating one of a total area of a pattern assigned to a stripe region concerned and a number of shots of a charged particle beam for writing the pattern assigned to the stripe region concerned, for each stripe region of the plurality of stripe regions, setting a writing order of the plurality of stripe regions to be an ascending order of the one of the total area of the pattern and the number of shots, and writing a pattern with a charged particle beam in the plurality of stripe regions, in the ascending order of the one of the total area of the pattern and the number of shots.

Moreover, in accordance with another aspect of the present invention, a charged particle beam writing method includes setting a settling time for a deflection amplifier of a deflector that deflects a charged particle beam onto a target object, virtually dividing a writing region of a target object into a plurality of strip-shaped stripe regions, calculating one of a total area of a pattern assigned to a stripe region concerned and a number of shots of a charged particle beam for writing the pattern assigned to the stripe region concerned, for each stripe region of the plurality of stripe regions, determining whether a difference between the one of the total area of the pattern and the number of shots with respect to one of adjacent stripe regions of the plurality of stripe regions and the one of the total area of the pattern and the number of shots with respect to an other of adjacent stripe regions exceeds a corresponding threshold value, and writing a pattern with a charged particle onto the plurality of stripe regions such that a shot of a next beam is deflected after a settling time longer than a settling time having been set has passed with respect to a stripe region whose one of the total area of the pattern and the number of shots is larger than that of an other stripe region in the adjacent stripe regions in which the difference exceeds the corresponding threshold value, and after the settling time having been set has passed with respect to other stripe regions different from the adjacent stripe regions.

Further, in accordance with another aspect of the present invention, a charged particle beam writing apparatus includes a dividing unit configured to virtually divide a writing region of a target object into a plurality of strip-shaped stripe regions, a calculation unit configured to calculate one of a total area of a pattern assigned to a stripe region concerned and a number of shots of a charged particle beam for writing the pattern assigned to the stripe region concerned, for each stripe region of the plurality of stripe regions, a determination unit configured to perform determining whether a difference between the one of the total area of the pattern and the number of shots with respect to one of adjacent stripe regions of the plurality of stripe regions and the one of the total area of the pattern and the number of shots with respect to an other of adjacent stripe regions exceeds a corresponding threshold value, a re-division unit configured, in a case where the difference exceeds the corresponding threshold value as a result of the determining, to re-divide a stripe region whose one of the total area of the pattern and the number of shots is larger than that of an other stripe region in the adjacent stripe regions so that the difference of the one of the total area of the pattern and the number of shots becomes lower than or equal to the corresponding threshold value, and a writing unit configured to write a pattern, with a charged particle beam, in the plurality of stripe regions including the stripe region having been re-divided, in a writing order of arrangement of the plurality of stripe regions.

Furthermore, a charged particle beam writing apparatus includes a dividing unit configured to virtually divide a writing region of a target object into a plurality of strip-shaped stripe regions, a calculation unit configured to calculate one of a total area of a pattern assigned to a stripe region concerned and a number of shots of a charged particle beam for writing the pattern assigned to the stripe region concerned, for each stripe region of the plurality of stripe regions, a setting unit configured to set a writing order of the plurality of stripe regions to be an ascending order of the one of the total area of the pattern and the number of shots, and a writing unit configured to write a pattern with a charged particle beam in the plurality of stripe regions, in the ascending order of the one of the total area of the pattern and the number of shots.

BRIEF DESCRIPTION OF THE DRAWINGS

FIGS. 6A to 6D show examples of a pattern layout and a step schematic diagram of each step according to the first embodiment;

FIGS. 10A to 10D show an example of a pattern layout and a step schematic diagram of each step according to the second embodiment;

FIGS. 18A to 18C are graphs showing an example of writing processing by rearrangement of a writing order and stripe re-division according to the fourth embodiment;

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaping type beam writing apparatus will be described as an example of a charged particle beam apparatus.

In the embodiments below, a writing apparatus and method that can reduce or suppress the decrease of the accuracy of the writing position at the place where a pattern density difference occurs in the writing, while reducing the decrease of the throughput will be described.

First Embodiment

Figure 1:
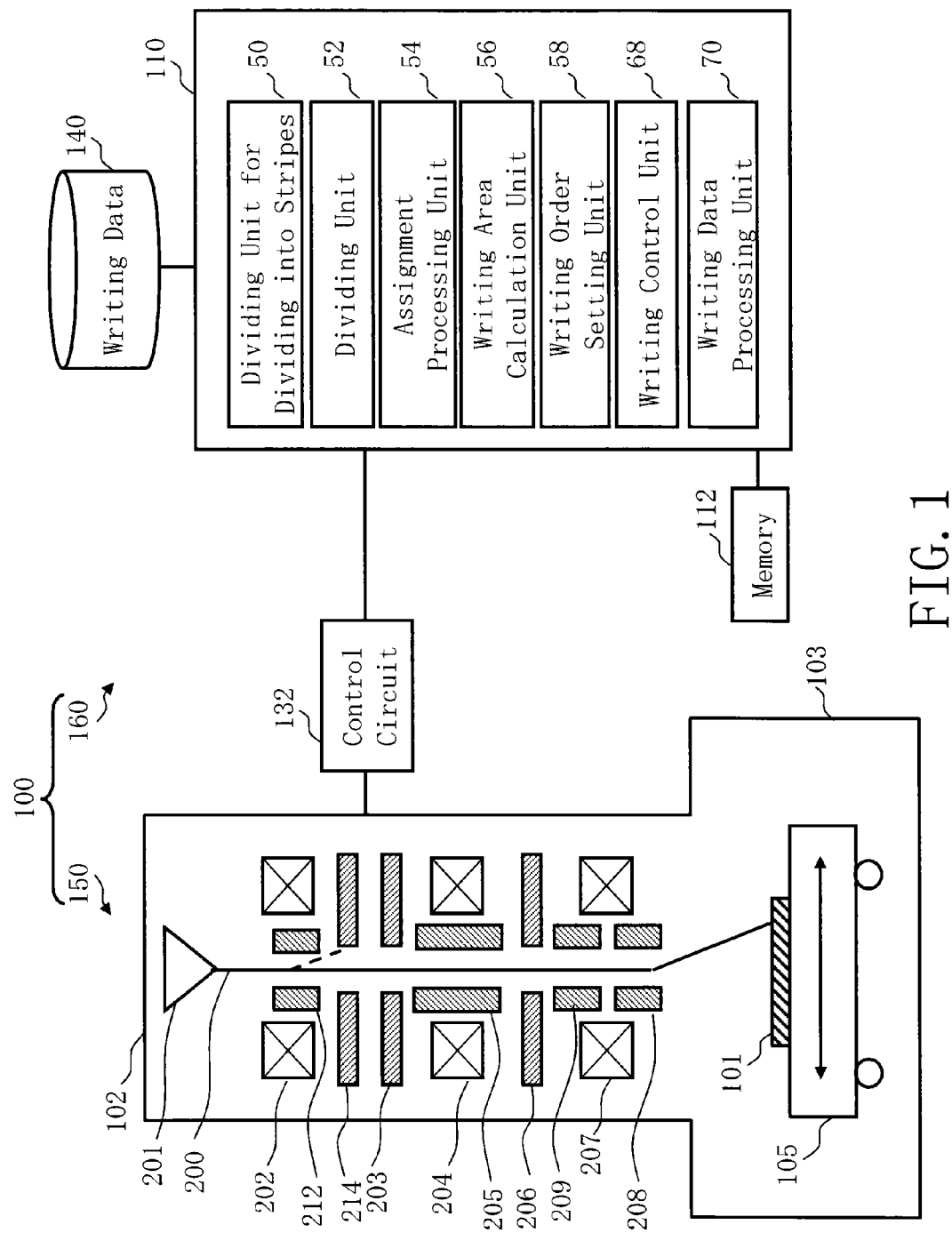
FIG. 1 is a schematic diagram showing a configuration of a writing apparatus according to the first embodiment.

FIG. 1 is a schematic diagram showing a configuration of a writing apparatus according to the first embodiment. As shown in FIG. 1, a writing (or "drawing") apparatus 100 includes a writing unit 150 and a control unit 160. The writing apparatus 100 is an example of a charged particle beam writing apparatus. Particularly, it is an example of a variable shaping type (VSB) writing apparatus. The writing unit 150 includes an electron optical column 102 and a writing chamber 103. In the electron optical column 102, there are arranged an electron gun assembly 201, an illumination lens 202, a blanking deflector 212, a blanking aperture 214, a first aperture member 203, a projection lens 204, a deflector 205, a second aperture member 206, an objective lens 207, a main deflector 208 and a sub-deflector 209. In the writing chamber 103, there is arranged an XY stage 105. On the XY stage 105, a target object or "sample" 101 such as a mask serving as a writing target is placed when performing writing. The target object 101 is, for example, an exposure mask used for manufacturing semiconductor devices. The target object 101 may be, for example, a mask blank on which resist is applied and a pattern has not yet been formed.

The control unit 160 includes a control computer 110, a memory 112, a control circuit 132, and a storage device 140 such as a magnetic disk drive. The control computer 110, the memory 112, the control circuit 132, and the storage device 140 are mutually connected through a bus (not shown).

In the control computer 110, there are arranged a dividing unit 50 for dividing into stripes, a dividing unit 52, an assignment processing unit 54, a writing area calculation unit 56, a writing order setting unit 58, a writing control unit 68, and a writing data processing unit 70. Each function of them may be configured by hardware such as an electric circuit, or by software such as a program implementing these functions. Alternatively, they may be configured by a combination of software and hardware. Data which is input and output to/from the dividing unit 50 for dividing into stripes, the dividing unit 52, the assignment processing unit 54, the writing area calculation unit 56, the writing order setting unit 58, the writing control unit 68, or the writing data processing unit 70, and data being calculated are stored in the memory 112 each time.

FIG. 1 shows a configuration necessary for explaining the first embodiment. Other configuration elements generally necessary for the writing apparatus 100 may also be included. For example, a multiple stage deflector of two stages of the main deflector 208 and the sub deflector 209 is herein used for position deflection, but, however, a single stage deflector or a multiple stage deflector of three or more stages may also be used for position deflection. Moreover, an input device, such as a mouse, keyboard, etc., a monitoring device, an external interface circuit, etc. may also be connected to the writing apparatus 100.

Figure 2:
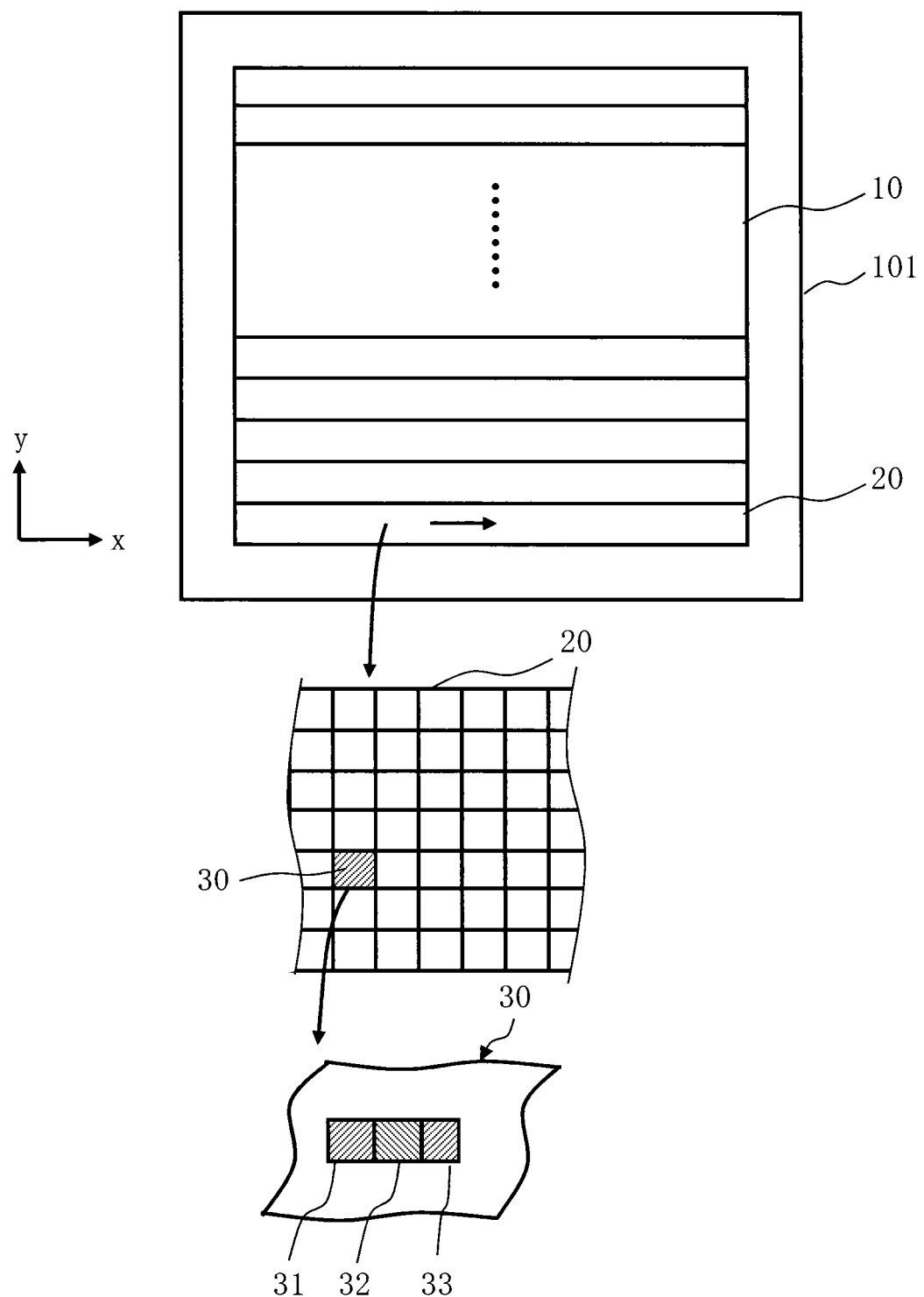
FIG. 2 is a conceptual diagram for explaining each region according to the first Embodiment.

FIG. 2 is a conceptual diagram for explaining each region according to the first Embodiment. In FIG. 2, a writing region 10 of the target object 101 is virtually divided into a plurality of strip-shaped stripe regions 20 in the y direction, each having a width deflectable by the main deflector 208. Further, each stripe region 20 is virtually divided into a plurality of subfields (SFs) 30 (small regions) each having a size deflectable by the sub deflector 209. Shot figures 31, 32, and 33 are written at corresponding shot positions in each SF 30.

The writing apparatus 100 performs writing processing in each stripe region 20 by using a multiple stage deflector. In this case, a two-stage deflector composed of the main deflector 208 and the sub deflector 209 is used as an example. While the XY stage 105 is continuously moving in the −x direction, for example, the first stripe region 20 is written in the x direction. After the first stripe region 20 has been written, the second stripe region 20 is written similarly or in the opposite direction. Then, in the same way, the third and subsequent stripe regions 20 are written. The main deflector 208 deflects the electron beam 200 in sequence to a reference position of the SF 30 so as to follow the movement of the XY stage 105. The sub deflector 209 deflects the electron beam 200 from the reference position of each SF 30 to each shot position of an irradiating beam in the SF30 concerned. Thus, the sizes of the deflection regions of the main deflector 208 and the sub deflector 209 are different from each other. In the two stage deflection, the SF 30 is the smallest deflection region in the deflection regions of the multiple stage deflector.

Figure 3:
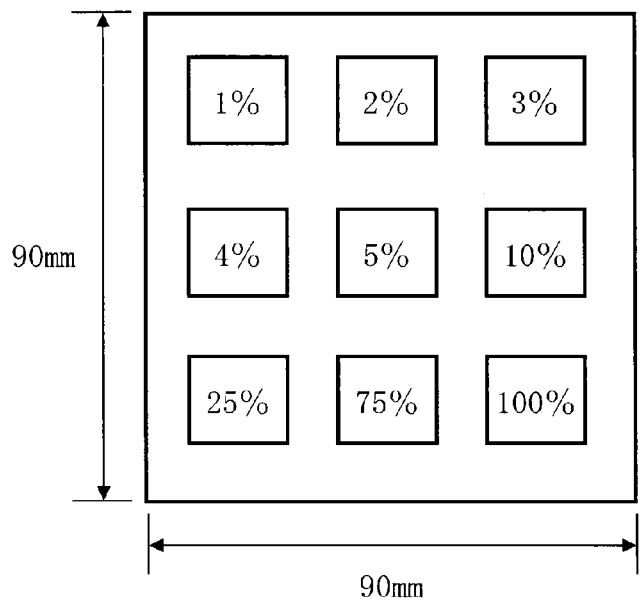
FIG. 3 shows an example of an evaluation pattern according to the first embodiment.

FIG. 3 shows an example of an evaluation pattern according to the first embodiment. In FIG. 3, the evaluation pattern is divided into a plurality of regions each have different pattern densities. In the example of FIG. 3, the regions whose pattern densities are 1%, 2%, 3%, 4%, 5%, 10%, 25%, 75%, and 100% are formed. Then, a measuring object pattern is put for each region of a different pattern density.

Figure 4:
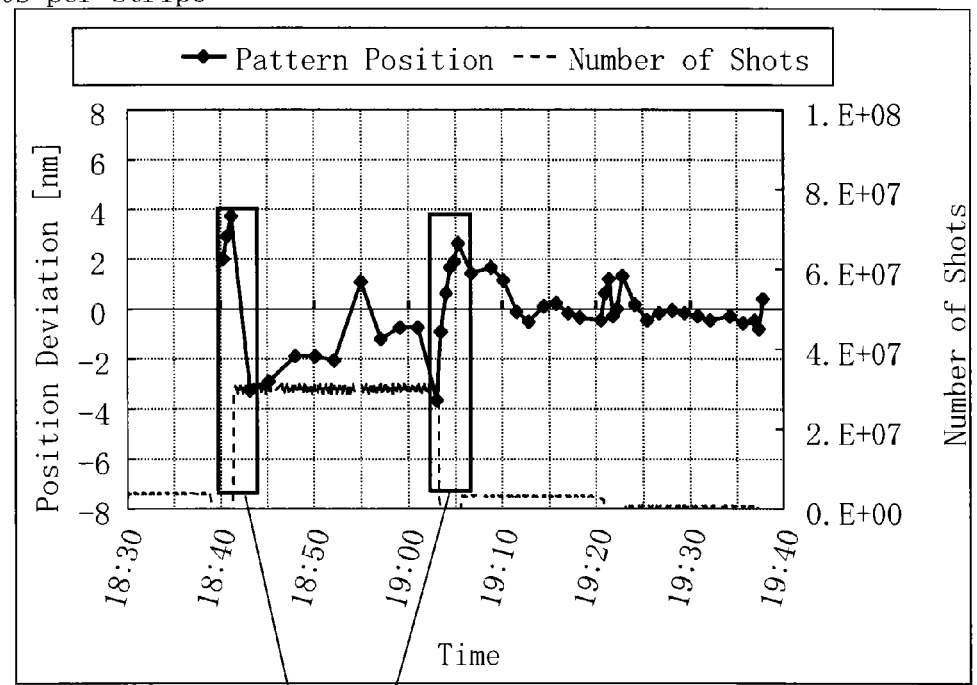
FIG. 4 is a graph showing an example of the relation between a position deviation amount and the number of shots according to the first embodiment.

FIG. 4 is a graph showing an example of the relation between a position deviation amount and the number of shots of a charged particle beam for writing a pattern assigned to a stripe region concerned according to the first embodiment. Using an evaluation pattern, FIG. 4 shows a part of a result obtained by measuring a position deviation amount of each measuring object pattern which is put for each of different pattern densities. The ordinate axis shows a position deviation amount and the number of shots per stripe, and the abscissa axis shows a clock time with respect to writing. A stripe region having many number of shots indicates a region having a high pattern density. As shown in FIG. 4, at the timing of the number of shots changing greatly, a large amount of position deviation occurs. Then, in the first embodiment, there will be described a method of suppressing the position deviation of a pattern in the case in which the number of shots (pattern density) greatly changes when comparing two stripe regions 20.

Figure 5:
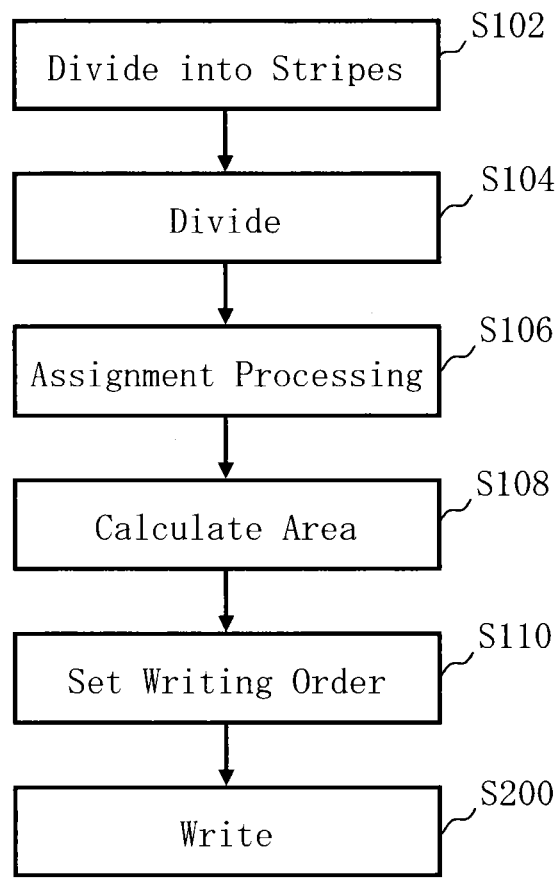
FIG. 5 is a flowchart showing main steps of a writing method according to the first embodiment.

FIG. 5 is a flowchart showing main steps of a writing method according to the first embodiment. In FIG. 5, the writing method of the first embodiment executes a series of steps: a dividing step (S102) of dividing into stripes, a shot dividing step (S104), an assignment processing step (S106), an area calculation step (S108), a writing order setting step (S110) and a writing step (S200).

FIGS. 6A to 6D show examples of a pattern layout and a step schematic diagram of each step according to the first embodiment. In FIG. 6A, a plurality of figure patterns are arranged as writing targets in the writing region of the target object 101.

In FIG. 6B, in the dividing step (S102) of dividing into stripes, the dividing unit 50 for dividing into stripes virtually divides the writing region 10 of the target object 101 into a plurality of strip-shaped stripe regions 20. In that case, the division width of each stripe region 20 is set to be fixed and deflectable by the main deflector 208. The dividing unit 50 for dividing into stripes is an example of a dividing unit.

In the shot dividing step (S104), the dividing unit 52 reads writing data (chip data) from the storage device 140, and divides a figure pattern defined in the writing data, for each stripe region 20, based on region information on the stripe region 20 obtained by virtual division.

In the assignment processing step (S106), the assignment processing unit 54 assigns each partial figure pattern made by dividing a figure pattern, to a corresponding stripe region 20.

In FIG. 6C, in the area calculation step (S108), the writing area calculation unit 56 calculates, for each stripe region, a total area of a pattern assigned to a stripe region concerned. The writing area calculation unit 56 is an example of a calculation unit.

In FIG. 6D, in the writing order setting step (S110), the writing order setting unit 58 sets the writing order of a plurality of stripe regions 20 to be in ascending order of the total area of a pattern. Regarding the examples of FIGS. 6A to 6D, the total area of a pattern becomes larger in order from a figure area A, a figure area C, and a figure area B (A<C<B) as shown in FIG. 6C. Then, as shown in FIG. 6D, the writing order is set to be in the order of the stripe region order of the figure area A stripe region, the figure area C stripe region, and the figure area B stripe region.

In the writing step (S200), the writing unit 150 writes a pattern in a plurality of stripe regions 20 with the electron beam 200 in the writing order, which is set according to the total pattern area of a pattern assigned to a stripe region concerned, in ascending order. In the case of the number of shots of a charged particle beam for writing a pattern assigned to a stripe region concerned having been calculated, the writing unit 150 writes a pattern in a plurality of stripe regions 20 with the electron beam 200 in writing order which is set according to the number of shots in ascending order.

In performing writing processing, first, the writing data processing unit 70 reads writing data from the storage device 140, and performs data conversion processing of a plurality of steps for the writing data so as to generate apparatus-specific shot data. A plurality of figure patterns are defined in the writing data.

It needs to divide each figure pattern defined in the writing data to be the size that can be irradiated by one beam shot in order to write figure patterns by the writing apparatus 100. Then, for actually performing writing, the writing data processing unit 70 generates a shot figure by dividing each figure pattern into the size that can be irradiated by one beam shot. Shot data is generated for each shot figure. Figure data, such as a figure type, a figure size, and an irradiation position, is defined in the shot data. In addition, an irradiation time in accordance with a dose is also defined. The shot data is sorted in order of shot so as to be defined.

Under the control of the writing control unit 68, the control circuit 132 makes the writing unit 150 operate. The writing unit 150 writes a pattern in each stripe region 20 of the target object 101 in the writing order which is set according to the total pattern area in ascending order. Specifically, it operates as follows.

The electron beam 200 emitted from the electron gun assembly 201 (an emission unit) is controlled by the blanking deflector 212 when passing through the blanking deflector 212, to pass through the blanking aperture 214 when in the "beam on" state, and to be deflected such that the entire beam is blocked by the blanking aperture 214 when in the "beam off" state. The electron beam 200 that has passed through the blanking aperture 214 during the period from the "beam off" state to the "beam on" state and again changing to the "beam off" state serves as one shot of the electron beam. The blanking deflector 212 controls the direction of the passing electron beam 200 to alternately generate the "beam on" state and the "beam off" state. For example, no voltage should be applied when in the "beam on" state, and a voltage should be applied to the blanking deflector 212 when in the "beam off" state. The dose per shot of the electron beam 200 to irradiate the target object 101 is adjusted depending upon an irradiation time t" of each shot.

As described above, each shot of the electron beam 200, generated by passing through the blanking deflector 212 and the blanking aperture 214, irradiates the whole of the first shaping aperture 203 having a quadrangular opening by the illumination lens 202. Here, the electron beam 200 is first shaped to a quadrangle. Then, after having passed through the first shaping aperture 203, the electron beam 200 of the first aperture image is projected onto the second shaping aperture 206 by the projection lens 204. The first aperture image on the second shaping aperture 206 is deflection controlled by the deflector 205 so as to change (variably shape) the beam shape and the beam size. Such variable beam shaping is performed for each shot, and, generally, each shot is shaped to have a different shape and size. Then, after having passed through the second shaping aperture 206, the electron beam 200 of the second aperture image is focused by the objective lens 207, and deflected by the main deflector 208 and the sub deflector 209 to reach a desired position on the target object 101 placed on the XY stage 105 which is continuously moving. FIG. 1 shows the case of using multiple stage deflection of the main and sub deflection for position deflection. In such a case, the electron beam 200 of a shot concerned should be deflected to a reference position in an SF 30 by the main deflector 208 while following the movement of the stage, and the beam of a shot concerned should be deflected to each irradiation position in the SF by the sub deflector 209. A figure pattern defined in writing data is written, for each stripe region, by repeating such operations and combining a shot figure of each shot.

In the above example, the case of calculating the area of a pattern for each stripe region has been described, and it is also preferable to calculate the number of shots used when writing a pattern assigned to the stripe region 20 concerned, for each stripe region 20.

In such a case, after the assignment processing step (S106), the writing data processing unit 70 generates a shot figure by dividing each figure pattern assigned to each stripe region into the size that can be irradiated by one beam shot in order to actually perform writing. When calculating the number of shots, what is necessary is just to read the area calculation step (S108) as the number of shots calculation step (S108). Similarly, the writing area calculation unit 56 should be read as the number of shots calculation unit 56. Then, the number of shots calculation unit 56 calculates the number of shots by calculating the number of shot figures arranged in a stripe region, for each stripe region.

In the writing order setting step (S110), the writing order setting unit 58 should set the writing order of a plurality of stripe regions 20 according to the number of shots in ascending order.

In the writing step (S200), when calculating the number of shots, the writing unit 150 writes a pattern in a plurality of stripe regions 20 with the electron beam 200 in the writing order which is set according to the number of shots in ascending order.

As described above, according to the first embodiment, the writing order of a plurality of stripe regions is rearranged to be a writing order which is set according to the total area or the number of shots of a pattern in ascending order.

Figures 7A, 7B:
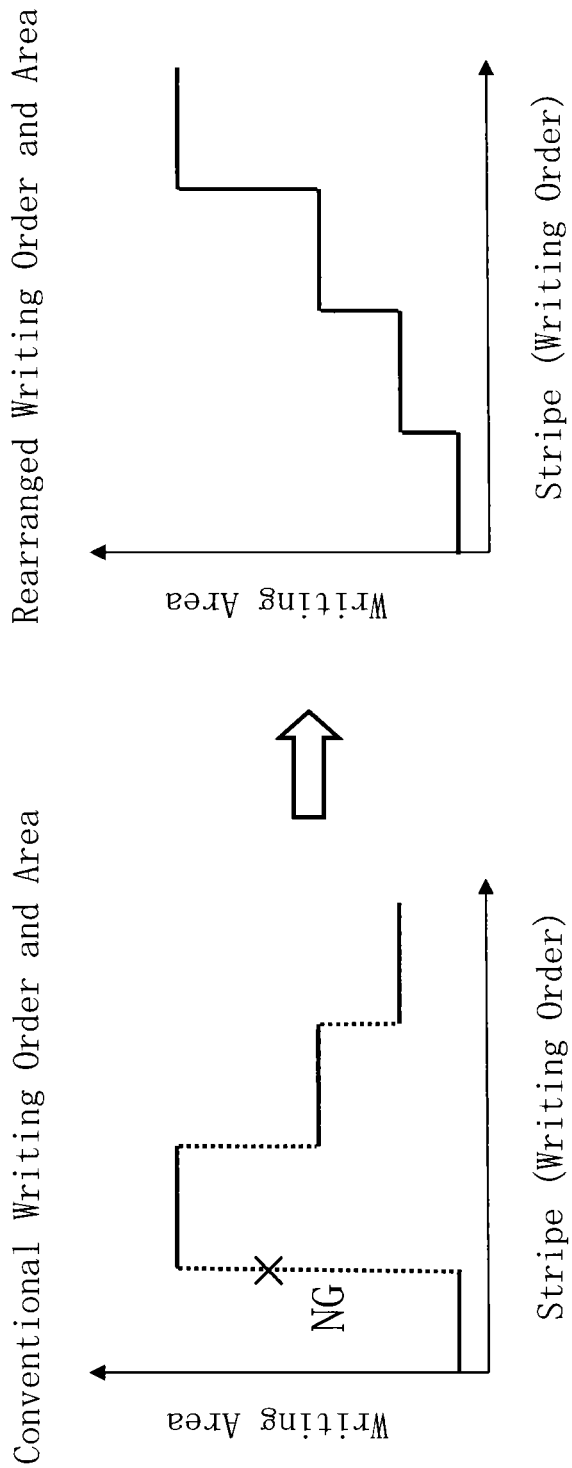
FIGS. 7A and 7B are graphs showing an example of rearrangement of a writing order according to the first embodiment.

FIGS. 7A and 7B are graphs showing an example of rearrangement of a writing order according to the first embodiment. In FIGS. 7A and 7B, the ordinate axis shows a writing area, and the abscissa axis shows a stripe. FIG. 7A shows the case in which writing is performed according to the position of a stripe region, without rearranging, regardless of a writing area. FIG. 7A shows that the position deviation becomes large (NG) at the place where the area sharply changes. FIG. 7B shows the case in which writing is performed after rearranging the writing order according to the first embodiment. By performing rearrangement of the writing order to be according to the area of the stripe region in ascending order, the area difference between adjacent stripe regions can be lessened as shown in FIG. 7B. Accordingly, a sharp area change (pattern density change) can be suppressed. Therefore, the position deviation of a pattern to be written can be suppressed or reduced. Furthermore, since the number of stripe regions is not increased, decrease of the throughput can be suppressed.

As described above, according to the first embodiment, decrease of the accuracy of the writing position at the place where a pattern density difference occurs in writing can be reduced or suppressed while reducing the decrease of the throughput.

Second Embodiment

In the second embodiment, there will be described a configuration in which re-division is performed for only a stripe region corresponding to the place where the area (or the number of shots) sharply changes (changing over an acceptable threshold value) between adjacent stripe regions.

Figure 8:
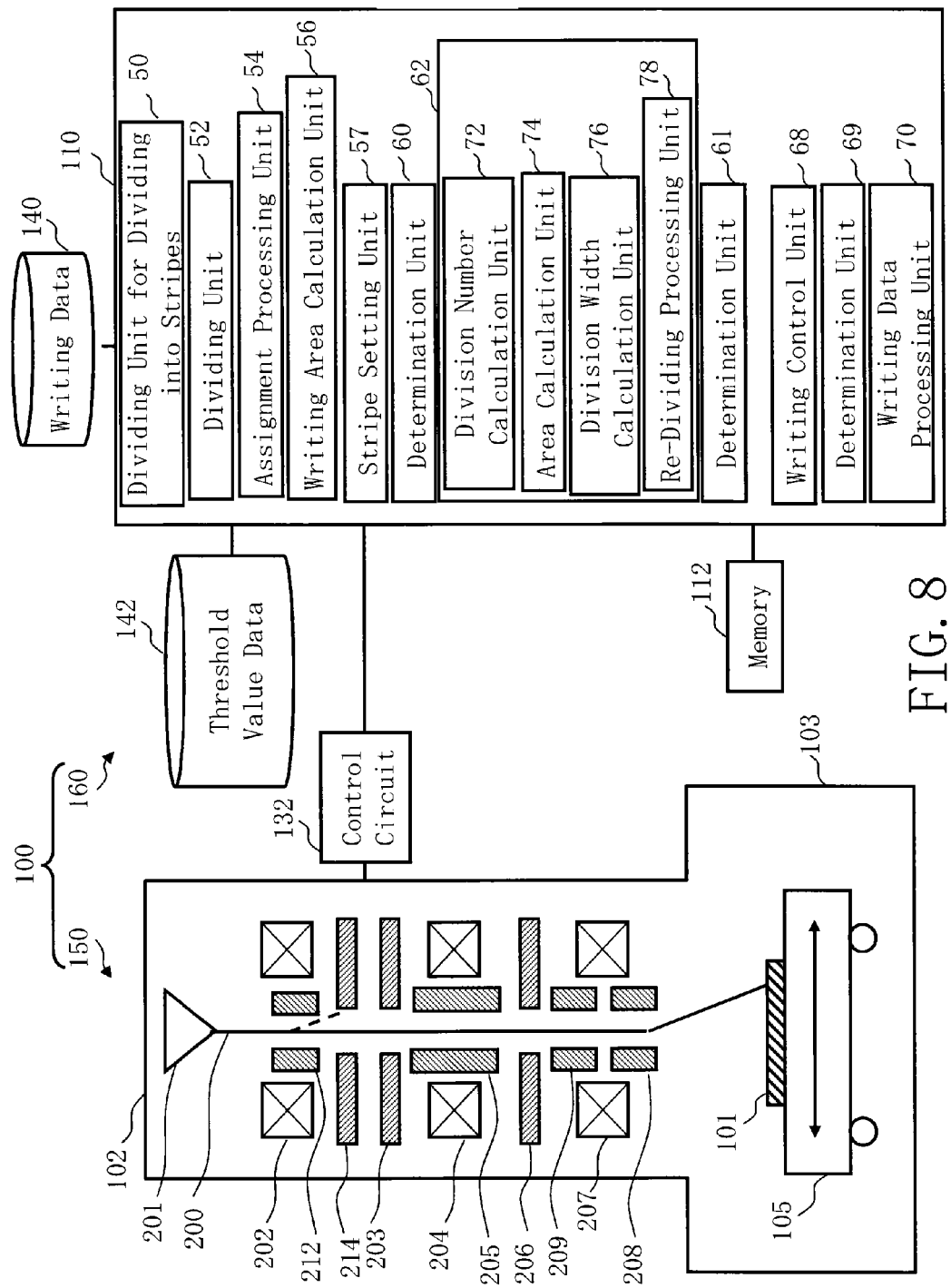
FIG. 8 is a schematic diagram showing the structure of a writing apparatus according to the second embodiment.

FIG. 8 is a schematic diagram showing the structure of a writing apparatus according to the second embodiment. FIG. 8 is the same as FIG. 1 except that a storage device 142 such as a magnetic disk drive is added, and a stripe setting unit 57, determination units 60, 61, and 69, and a re-dividing unit 62 are arranged instead of the writing order setting unit 58 in the control computer 110. Moreover, the re-dividing unit 62 includes a division number calculation unit 72, an area calculation unit 74, a division width calculation unit 76, and a re-dividing processing unit 78.

The control computer 110, the memory 112, the control circuit 132, the storage device 140, and the storage device 142 are mutually connected through a bus (not shown).

Functions, such as the dividing unit 50 for dividing into stripes, the dividing unit 52, the assignment processing unit 54, the writing area calculation unit 56, the stripe setting unit 57, the determination units 60, 61, and 69, the re-dividing unit 62, the writing control unit 68, and the writing data processing unit 70 may be configured by hardware such as an electric circuit, or by software such as a program implementing these functions. Alternatively, they may be configured by a combination of hardware and software. Data which is input and output to/from, the dividing unit 50 for dividing into stripes, the dividing unit 52, the assignment processing unit 54, the writing area calculation unit 56, the stripe setting unit 57, the determination units 60, 61, and 69, the re-dividing unit 62, the writing control unit 68, or the writing data processing unit 70, and data being calculated are stored in the memory 112 each time.

Figure 9:
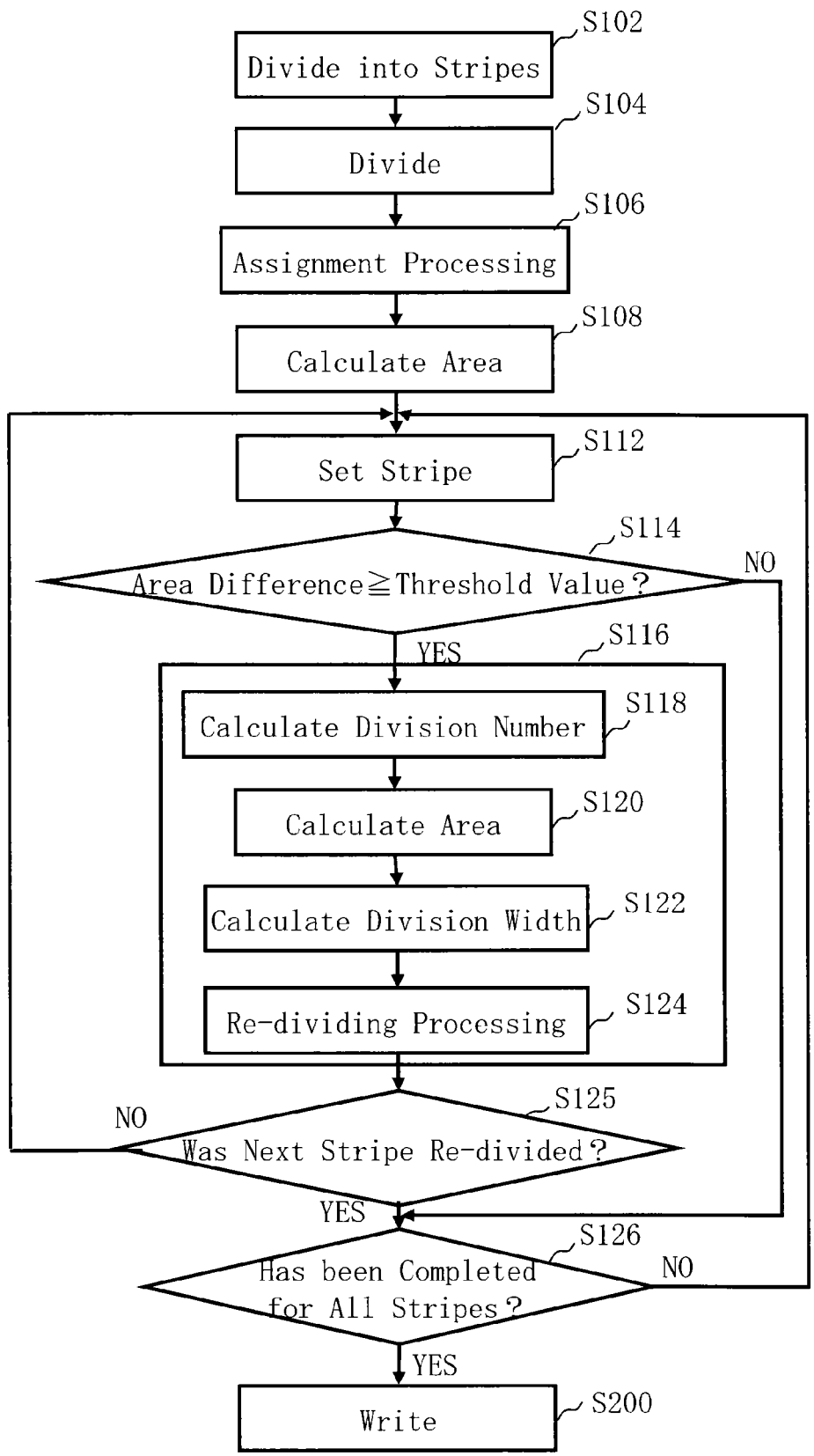
FIG. 9 is a flowchart showing main steps of a writing method according to the second embodiment.

FIG. 9 is a flowchart showing main steps of a writing method according to the second embodiment. FIG. 9 is the same as FIG. 5 except that a stripe setting step (S112), a determination step (S114), a re-dividing step (S116), a determination step (S125), and a determination step (S126) are added instead of the writing order setting step (S110). Moreover, the re-dividing step (S116) executes a series of steps as internal steps: a division number calculation step (S128), an area calculation step (S120), a division width calculation step (S122), and a re-dividing processing step (S124).

FIGS. 10A to 10D show an example of a pattern layout and a step schematic diagram of each step according to the second embodiment. In FIG. 10A, a plurality of figure patterns are arranged as writing targets in the writing region of the target object 101.

The contents of each step from the dividing step (S102) of dividing into stripes to the area calculation step (S108) are the same as those of the first embodiment. That is, in FIG. 10B, in the dividing step (S102) of dividing into stripes, the dividing unit 50 for dividing into stripes virtually divides the writing region 10 of the target object 101 into a plurality of strip-shaped stripe regions 20. In that case, similarly to the first embodiment, the division width of each stripe region 20 is set to be fixed. After performing the shot dividing step (S104) and the assignment processing step (S106), the writing area calculation unit 56 calculates a total area of a pattern assigned to the stripe region concerned, for each stripe region, in the area calculation step (S108), in FIG. 10C. Regarding the examples of FIGS. 10A to 10D, the figure area B is much larger than the figure area A, and the figure area C is smaller than the figure area B as shown in FIG. 10C. According to the second embodiment, comparing adjacent stripe regions 20 in order, re-division is performed for only a stripe region corresponding to the place where the area (or the number of shots) sharply changes (changing over an acceptable threshold value) between the adjacent stripe regions.

Figures 11A, 11B:
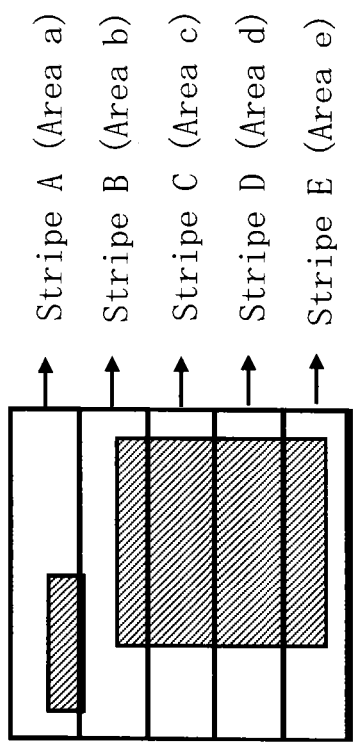
FIGS. 11A and 11B are conceptual diagrams showing another example of a pattern layout and an example of a determination result of an area difference according to the second embodiment.

FIGS. 11A and 11B are conceptual diagrams showing another example of a pattern layout and an example of a determination result of an area difference according to the second embodiment. The example of FIG. 11A shows five stripe regions of stripes A to E and total areas a to e of patterns of respective stripe regions.

In the stripe setting step (S112), the stripe setting unit 57 set a stripe region serving as a determination target. For example, it is preferable to set stripe regions such that the smaller the writing order of a stripe region is, the earlier the stripe region is set. For example, here, the stripe A is set first.

In the determination step (S114), the determination unit 60 determines whether a difference between total areas of patterns of adjacent stripe regions 20 exceeds a corresponding threshold value or not. For example, the stripe region A is compared with the stripe region B which is adjacent to the stripe region A. An area difference acceptable value T is used as a threshold value. Threshold value information, such as the area difference acceptable value T, etc., should be stored in the storage device 142 in advance, and when necessary, it should be read from the storage device 142. Now, it is determined whether an area difference t' (an absolute value) between the stripe A and the stripe B exceeds the area difference acceptable value T. Regarding the example of FIG. 11A, the area difference t' (absolute value) between the stripe A and the stripe B is less than or equal to the area difference acceptable value T, which is represented as "No" as shown in FIG. 11B. In such a case, it proceeds to the determination step (S126).

In the determination step (S126), the determination unit 69 determines whether the determination step (S114) has been completed for all the stripe regions. If a stripe region for which the determination step (S114) has not been finished yet exists, it returns to the stripe setting step (S112). Regarding the example of FIG. 11A, since the stripes B to E still remain, it returns to the stripe setting step (S112).

In the stripe setting step (S112), the stripe setting unit 57 sets the stripe B as a next determination target. In the determination step (S114), the determination unit 60 compares the stripe B and the stripe C which is adjacent to the stripe B. Regarding the example of FIG. 11A, the area difference t' (absolute value) between the stripe B and the stripe C exceeds the area difference acceptable value T, which is represented as "Yes" as shown in FIG. 11B. In such a case, it proceeds to the re-dividing step (S116).

In FIG. 10D, in the re-dividing step (S116), when the area difference t (absolute value) exceeds the area difference acceptable value T (threshold value) as a result of the determination, the re-dividing unit 62 re-divides a stripe region whose total pattern area is larger than that of the adjacent stripe region so that the area difference t of a pattern, (namely, a difference between total areas), may be less than or equal to the area difference acceptable value T. In the example of FIG. 11A, the pattern area of the stripe C is larger than that of the stripe B, for example. Therefore, the stripe C is re-divided. The re-dividing a stripe region is performed as follows.

In the division number calculation step (S118), the division number calculation unit 72 calculates the number of divisions (division number) into which a stripe region is re-divided. A division number n' is defined as the minimum natural number in natural numbers n which satisfy the following equation (1). In this case, the pattern areas of adjacent stripes S1 and S2 are respectively indicated as $s_1$ and $s_2$. Let $s_2 > s_1$. A set area difference, which is an area difference to be set for dividing a stripe, shall be t. The set area difference t is set to satisfy $0 < t \leq T$. In the example of FIG. 11A, since the pattern area of the stripe C is larger than that of the stripe B, $s_1 = b$ and $s_2 = c$.

$$s_2 < n \cdot s_1 + n(n+1)/2 \qquad (1)$$

In the area calculation step (S120), the area calculation unit 74, first, calculates a reference area M. The reference area M is defined by the following equation (2).

$$M = \{s_2 - n'(n'+1)/2\} \cdot t/n' \qquad (2)$$

Next, with respect to n' stripe regions after division, the area calculation unit 74 calculates an area of each of the n' stripe regions after division such that the pattern area of a stripe region becomes large in ascending order from a stripe region close to the stripe region whose pattern area is smaller and which is a compared stripe region for determination toward a stripe region which is far from the compared stripe region. Here, since the compared stripe region for determination is the stripe B, the areas of the n' stripe regions after dividing are calculated to be large in order from the pattern area of the first stripe region, such as (M+t), (M+2t), (M+3t), ..., and (M+n't).

In the division width calculation step (S122), the division width calculation unit 76 calculates respective division widths (stripe widths) for a plurality of the stripe regions to be obtained by the re-dividing so that pattern areas of n' stripe regions after division may become larger in order such as (M+t), (M+2t), (M+3t), ...., and (M+n't) as described above.

In the re-dividing processing step (S124), the re-dividing processing unit 78 performs dividing processing of the stripe region (the stripe C, in this case) being a re-dividing target by using each division width (stripe width) described above. Thereby, a stripe region (the stripe C, in this case) being a re-dividing target is re-divided into n' stripe regions. Since the pattern areas of the n' stripe regions after division are (M+t), (M+2t), (M+3t), ..., (M+n't) described above, they are increased in order. In the n' stripe regions having been re-divided by the operation described above, since the area difference t' (absolute value) between adjacent stripes is the set area difference t, it goes without saying that the area difference t' is within the area difference acceptable value T (threshold value). Moreover, it should be understood that the area difference t' (absolute value) between the stripe B and the first stripe of the n' stripe regions after division is also within the area difference acceptable value T (threshold value).

In the determination step (S125), the determination unit 61 determines whether the re-divided stripe region is the next stripe region to the stripe region which is currently set. When the re-divided stripe region is the next stripe region, it proceeds to the determination step (S126). When the re-divided stripe region is not the next stripe region but the stripe region which is currently set, it returns to the stripe setting step (S112). In the example of FIG. 11A, since the stripe C whose pattern area is larger than that of the stripe B is re-divided, the re-divided stripe region becomes the stripe region which is currently set.

In the determination step (S126), the determination unit 69 determines whether the determination step (S114) has been completed for all the stripe regions. If a stripe region for which the determination step (S114) has not been finished yet exists, it returns to the stripe setting step (S112). In the example of FIG. 11A, since the stripes C to E still remain, it returns to the stripe setting step (S112).

In the stripe setting step (S112), the stripe setting unit 57 sets the stripe C as the next determination target. However, in this case, since the stripe C has been divided into n' stripe regions by the re-dividing step (S116), the n'-th stripe region in the n' stripe regions after division is set as a determination target.

In the determination step (S114), the determination unit 60 compares the n'-th stripe region of the stripe C after division and the stripe D which is a stripe region 20 adjacent to the n'-th stripe region after division. Although the example of FIG. 11B shows that the area difference t' (absolute value) between the stripe C before division and the stripe D is less than or equal to the area difference acceptable value T, which is represented as "No", there may exist the case where, because of the re-division of the stripe C, the area difference t' (absolute value) between the n'-th stripe region after division and the stripe D exceeds the area difference acceptable value T. In such a case, what is necessary is to execute the re-dividing step (S116) and the determination step (S125) described above.

If either one of the n'-th stripe region of the stripe C after division and the stripe D is re-divided, in the determination step (S125), the determination unit 61 determines whether the re-divided stripe region is the next stripe region to the stripe region which is currently set. If the re-divided stripe region is the next stripe region (the stripe D, in this case), it proceeds to the determination step (S126). If the re-divided stripe region is the n'-th stripe region of the stripe C after division, it returns to the stripe setting step (S112). In the case of re-dividing a stripe region which is currently set, in other words, in the case of re-dividing a stripe region whose writing order is earlier, the area difference t' (absolute value) between the n'-th stripe region and the (n'−1)th stripe region which is further earlier stripe region may exceed the area difference acceptable value T. In light of this case, in the stripe setting step (S112), the stripe setting unit 57 sets, as a determination target, the stripe region which is one region before the re-divided stripe region (for example (n'−1). Hereafter, each step in accordance with the flowchart from the stripe setting step (S112) to the determination step (S126) is similarly repeated until the determination step (S114) has been completed for all the stripe regions in the determination step (S126).

In the writing step (S200), the writing unit 150 writes a pattern in a plurality of stripe regions 20 including re-divided stripe regions with the electron beam 200 in the writing order of arrangement of the plurality of stripe regions. The contents of the writing step (S200) are the same as those in the first embodiment except for the order of writing of stripe regions.

Figures 12A, 12B:
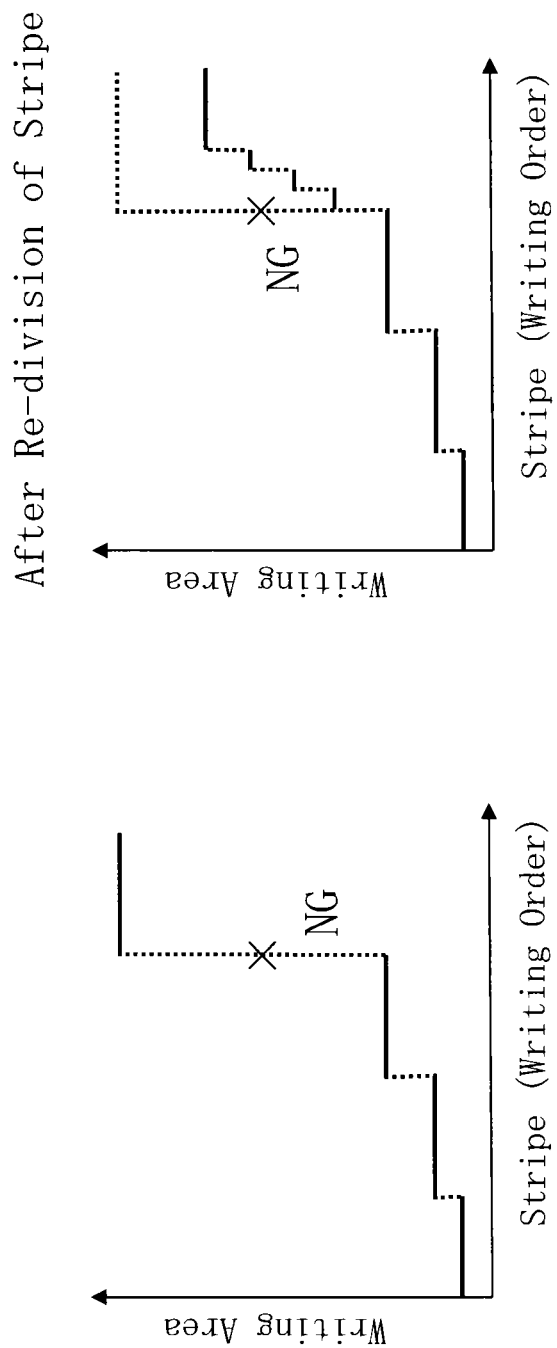
FIGS. 12A and 12B are graphs showing an example of writing processing after re-dividing a stripe according to the second embodiment.

FIGS. 12A and 12B are graphs showing an example of writing processing after re-dividing a stripe according to the second embodiment. In FIGS. 12A and 12B, the ordinate axis shows a writing area, and the abscissa axis shows a stripe. FIG. 12A shows that the position deviation becomes large (NG) at the place where the area sharply changes. FIG. 12B shows the case in which writing is performed after re-dividing a stripe according to the second embodiment. By performing the stripe re-division, the area difference between adjacent stripe regions can be lessened as shown in FIG. 12B. Accordingly, a sharp area change (pattern density change) can be suppressed. Therefore, the position deviation of a pattern to be written can be suppressed or reduced. Furthermore, since the increase of the number of stripe regions can be suppressed to be least, decrease of the throughput can be suppressed.

In the above example, the case where the area of a pattern is calculated for each stripe region is described. Further, it is also preferable to calculate, instead of the area of a pattern, the number of shots used when writing a pattern assigned to the stripe region 20 concerned, for each stripe region 20. In such a case, what is necessary is just to read each step of FIG. 9 as each following step as follows. Other contents are the same as those described above.

When using the number of shots instead of the area of a pattern, after the assignment processing step (S106), the writing data processing unit 70 generates a shot figure by dividing each figure pattern assigned to each stripe region into the size that can be irradiated by one beam shot, in order to actually perform writing. When calculating the number of shots, the area calculation step (S108) should be read as a number of shots calculation step (S108). Similarly, the writing area calculation unit 56 should be read as a number of shots calculation unit 56. The number of shots calculation unit 56 calculates, for each stripe region, the number of shots by calculating the number of shot figures arranged in a stripe region.

In the determination step (S114), the determination unit 60 determines whether a difference between the number of shots of a charged particle beam for writing a pattern assigned to a stripe region concerned exceeds a corresponding threshold value or not with respect to adjacent stripe regions 20. The area difference t' (absolute value) should be read as a shot number difference t' (absolute value). Moreover, the area difference acceptable value T should be read as a shot number difference acceptable value T. That is, the determination unit 60 determines whether the pattern shot number difference t' (absolute value) exceeds the shot number difference acceptable value T with respect to adjacent stripe regions 20.

In the re-dividing step (S116), when the shot number difference t (absolute value) exceeds the shot number difference acceptable value T (threshold value) as a result of the determination, the re-dividing unit 62 re-divides a stripe region whose shot number of a pattern is larger than that of the adjacent stripe region so that the shot number difference t of a pattern may be less than or equal to the shot number difference acceptable value T.

In the division number calculation step (S128), in the equation (1), the number of shots of the adjacent stripes S1 and of S2 should be read as $s_1$ and $s_2$ respectively. Moreover, the set area difference t, which is used for dividing, should be read as a set shot number difference t.

In the area calculation step (S120), the area calculation unit 74 should be read as a shot number calculation unit 74. Moreover, the reference area M should be read as a reference shot number M. With respect to n' stripe regions after division, the area calculation unit 74 calculates an area of each of the n' stripe regions after division such that the number of shots becomes large in ascending order from a stripe region close to the stripe region whose shot number is smaller and which is a compared stripe region for determination toward a stripe region which is far from the compared stripe region.

In the division width calculation step (S122), the division width calculation unit 76 calculates respective division widths (stripe widths) so that the number of shots of the n' stripe regions after division may become larger in order such as (M+t), (M+2t), (M+3t), . . . . , and (M+n't) as described above.

The re-dividing processing step (S124) is performed. Thereby, a stripe region being a re-dividing target is re-divided into n' stripe regions. Since the number of shots of the n' stripe regions after division are (M+t), (M+2t), (M+3t), . . . , (M+n't) described above, they are increased in order. In the n' stripe regions having been re-divided by the operation described above, since the shot number difference t' (absolute value) between adjacent stripes is the set shot number difference t, it goes without saying that the shot number difference t' is within the shot number difference acceptable value T (threshold value). Moreover, it should be understood that the shot number difference t' (absolute value) between the stripe B and the first stripe of the n' stripe regions after division is also within the shot number difference acceptable value T (threshold value).

As described above, according to the second embodiment, only a partial stripe region is re-divided so that, with respect to adjacent stripe regions, the difference concerning the total area or the number of shots of a pattern may not exceed the corresponding threshold value. Since the writing processing is performed per stripe region, it is possible to lessen a change of the beam current amount applied to the target object 101 per unit time. Therefore, decrease of the accuracy of the writing position can be reduced or suppressed. Thus, according to the second embodiment, it is possible to eliminate the place where there occurs a pattern density difference causing the decrease of the accuracy of the writing position. Furthermore, according to the second embodiment, it is possible to reduce the number of stripes compared with the case where the number of stripes increases because all the stripe region widths are made narrow uniformly. Therefore, the decrease of the throughput can be reduced. Thus, according to the second embodiment, decrease of the accuracy of the writing position at the place where a pattern density difference occurs in writing can be reduced or suppressed while reducing the decrease of the throughput.

Third Embodiment

In the third embodiment, there will be described a configuration in which the shot cycle of a beam shot is lengthened (extended) at the place where the area (or the number of shots) sharply changes (changing over an acceptable threshold value) between adjacent stripe regions. Particularly, a configuration for extending a settling time will be described in the third embodiment.

Figure 13:
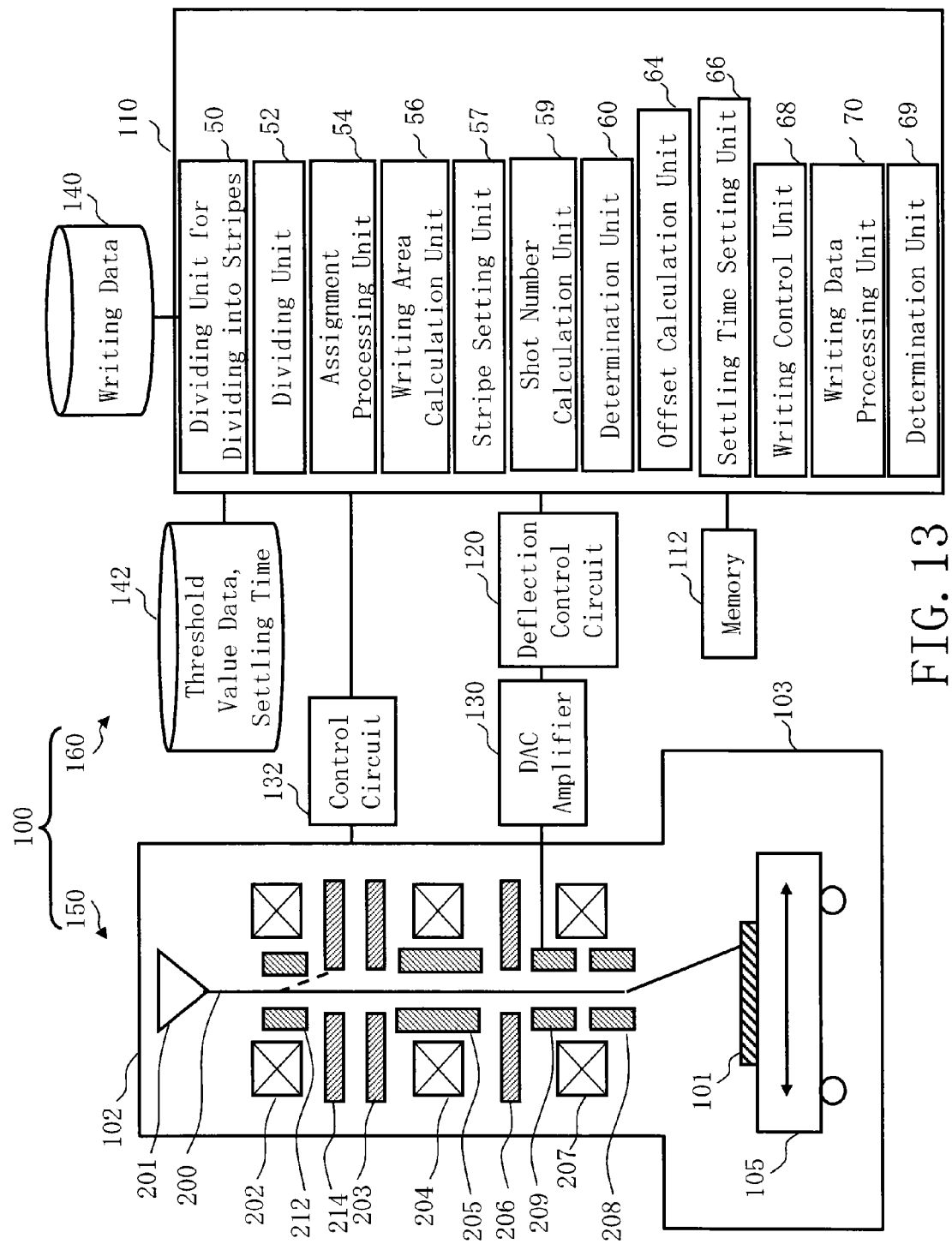
FIG. 13 is a schematic diagram showing the structure of a writing apparatus according to the third embodiment.

FIG. 13 is a schematic diagram showing the structure of a writing apparatus according to the third embodiment. FIG. 13 is the same as FIG. 1 except that a deflection control circuit 120, a digital analog conversion (DAC) amplifier unit 130, and a storage device 142 such as a magnetic disk drive are added, and a stripe setting unit 57, a shot number calculation unit 59, determination units 60 and 69, an offset calculation unit 64, and a settling time setting unit 66 are arranged instead of the writing order setting unit 58 in the control computer 110. In the first and second embodiments, although the deflection control circuit 120 and the DAC amplifier unit 130 are not shown in the figures since they are not particularly important for explanation, they are installed in the writing apparatus 100.

The control computer 110, the memory 112, the deflection control circuit 120, the DAC amplifier unit 130, the control circuit 132, the storage device 140, and the storage device 142 are mutually connected through a bus (not shown).

Functions, such as the dividing unit 50 for dividing into stripes, the dividing unit 52, the assignment processing unit 54, the writing area calculation unit 56, the stripe setting unit 57, the shot number calculation unit 59, the determination units 60 and 69, the offset calculation unit 64, the settling time setting unit 66, the writing control unit 68, and the writing data processing unit 70 may be configured by hardware such as an electric circuit, or by software such as a program implementing these functions. Alternatively, they may be configured by a combination of hardware and software. Data which is input and output to/from the dividing unit 50 for dividing into stripes, the dividing unit 52, the assignment processing unit 54, the writing area calculation unit 56, the stripe setting unit 57, the shot number calculation unit 59, the determination units 60 and 69, the offset calculation unit 64, the settling time setting unit 66, the writing control unit 68, or the writing data processing unit 70, and data being calculated are stored in the memory 112 each time.

Figure 14:
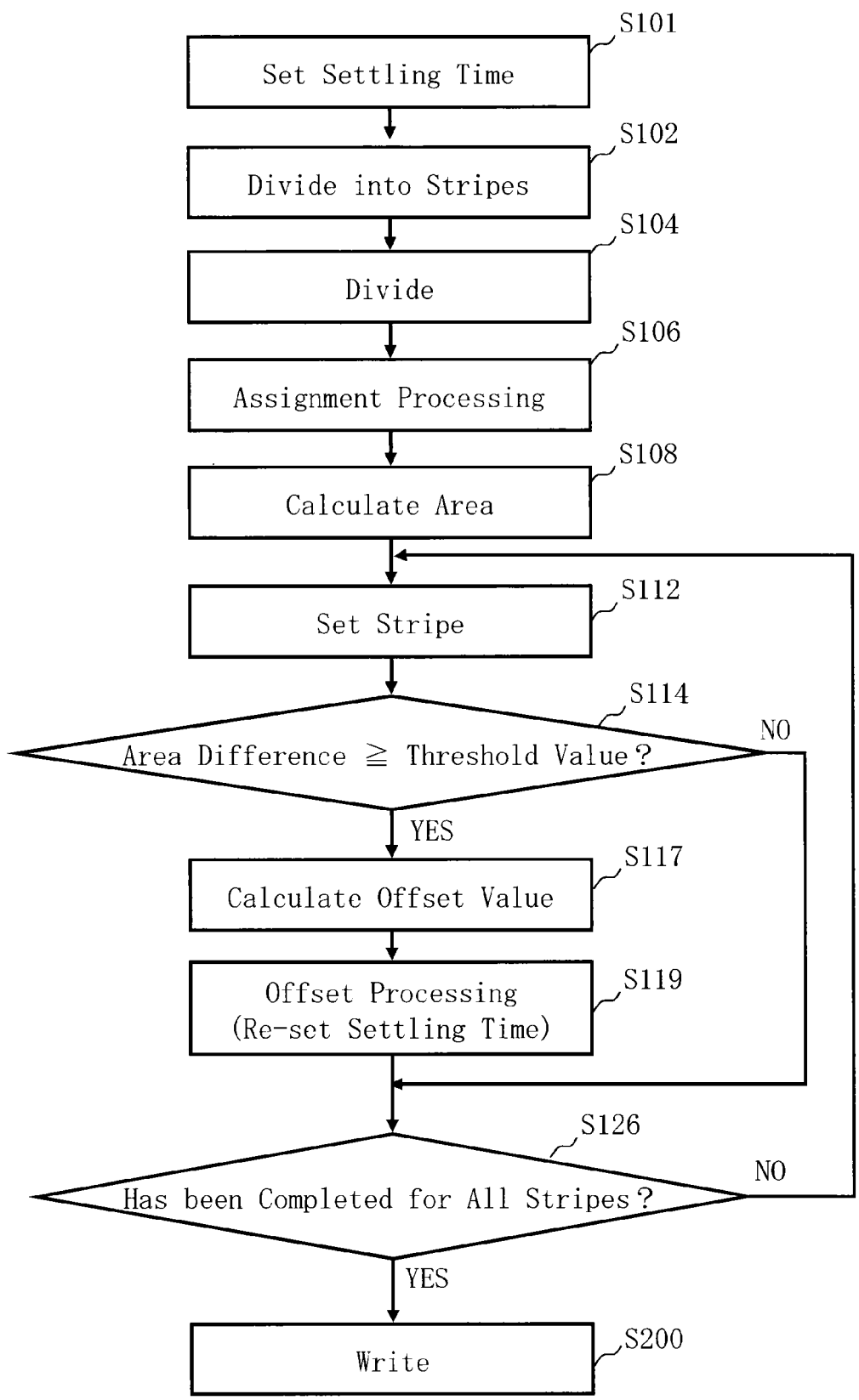
FIG. 14 is a flowchart showing main steps of a writing method according to the third embodiment.

FIG. 14 is a flowchart showing main steps of a writing method according to the third embodiment. FIG. 14 is the same as FIG. 5 except that a settling time setting step (S101), a stripe setting step (S112), a determination step (S114), an offset value calculation step (S117), an offset processing step (S119), and a determination step (S126) are added instead of the writing order setting step (S110).

Figure 15:
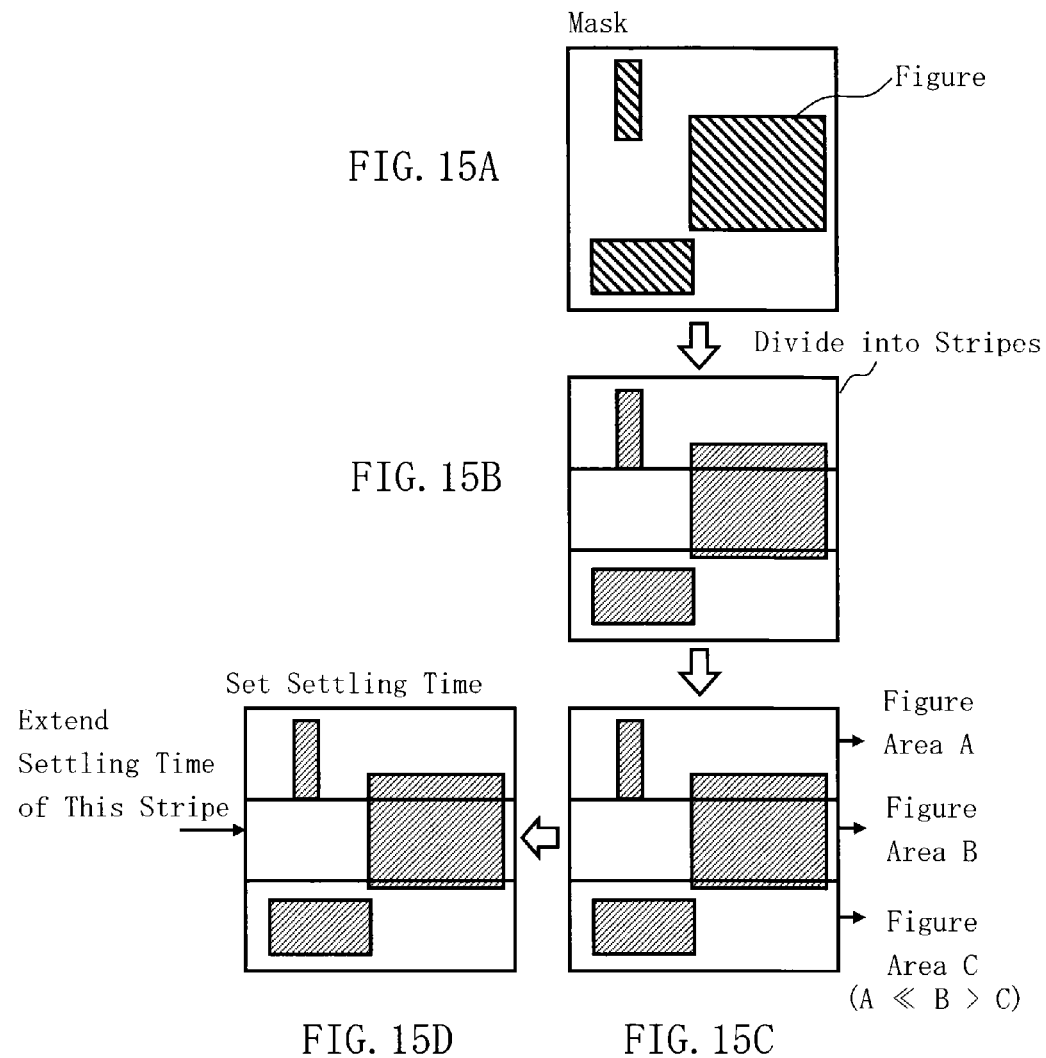
FIGS. 15A to 15D show an example of a pattern layout and a step schematic diagram of each step according to the third embodiment.

FIGS. 15A to 15D show an example of a pattern layout and a step schematic diagram of each step according to the third embodiment. In FIG. 15A, a plurality of figure patterns are arranged as writing targets in the writing region of the target object 101.

In the settling time setting step (S101), the settling time setting unit 66 sets a settling time for the deflection amplifier of the deflector which deflects the electron beam 200 onto the target object 101. When applying a deflection voltage to the deflector, it is necessary to apply a stable voltage. Therefore, a settling time for settling the deflection voltage needs to be set for the DAC amplifier which applies a deflection voltage to the deflector. Generally, the settling time is set to be variable in accordance with the amount of deflection (the amount of beam movement), and to be a time not to generate a position deviation due to shortage of settling time which is obtained in advance by an experiment etc. Data for the settling time is to be previously stored in the storage device 142, and to be read when necessary. A plurality of deflectors are arranged in the writing apparatus 100. In the third embodiment, there will be particularly described a settling time for the DAC amplifier unit 130 (deflection amplifier) for the sub-deflector 209 which extends the time interval between shots. In other words, the settling time setting unit 66 sets the settling time for the DAC amplifier unit 130 (deflection amplifier) for the sub-deflector 209.

The contents of each step from the dividing step (S102) of dividing into stripes to the area calculation step (S108) are the same as those of the first embodiment. That is, in FIG. 15B, in the dividing step (S102) of dividing into stripes, the dividing unit 50 for dividing into stripes virtually divides the writing region 10 of the target object 101 into a plurality of strip-shaped stripe regions 20. The division width of each stripe region 20 is set to be fixed similarly to the above. After performing the shot dividing step (S104) and the assignment processing step (S106), the writing area calculation unit 56 calculates a total area of a pattern assigned to the stripe region concerned, for each stripe region, in the area calculation step (S108), in FIG. 15C. Regarding the examples of FIG. 15A to FIG. 15D, the figure area B is much larger than the figure area A, and the figure area C is smaller than the figure area B as shown in FIG. 15C. According to the third embodiment, comparing adjacent stripe regions 20 in order, the settling time associated with writing a stripe region corresponding to the place where the area (or the number of shots) sharply changes (changing over an acceptable threshold value) between adjacent stripe regions is extended.

The third embodiment will be described with reference to FIGS. 11A and 11B. In the example of FIG. 11A, there are shown five stripe regions of stripes A to E and total areas a to e of patterns of respective stripe regions.

In the stripe setting step (S112), the stripe setting unit 57 set a stripe region serving as a determination target. For example, it is preferable to set stripe regions such that the smaller the writing order of a stripe region is, the earlier the stripe region is set. For example, here, the stripe A is set first.

In the determination step (S114), the determination unit 60 determines whether a difference between total areas of patterns of adjacent stripe regions 20 exceeds a corresponding threshold value or not. For example, the stripe region A is compared with the stripe region B which is adjacent to the stripe region A. An area difference acceptable value T is used as a threshold value. Threshold value information, such as the area difference acceptable value T etc., should be stored in the storage device 142 in advance, and when necessary, it should be read from the storage device 142. Now, it is determined whether an area difference t' (an absolute value) between the stripe A and the stripe B exceeds the area difference acceptable value T. Regarding the example of FIG. 11A, the area difference t' (absolute value) between the stripe A and the stripe B is less than or equal to the area difference acceptable value T, which is represented as "No" as shown in FIG. 11B. In such a case, it proceeds to the determination step (S126).

In the determination step (S126), the determination unit 69 determines whether the determination step (S114) has been completed for all the stripe regions. If a stripe region for which the determination step (S114) has not been finished yet exists, it returns to the stripe setting step (S112). Regarding the example of FIG. 11A, since the stripes B to E still remain, it returns to the stripe setting step (S112).

In the stripe setting step (S112), the stripe setting unit 57 sets the stripe B as a next determination target. In the determination step (S114), the determination unit 60 compares the stripe B and the stripe C which is adjacent to the stripe B. Regarding the example of FIG. 11A, the area difference t' (absolute value) between the stripe B and the stripe C exceeds the area difference acceptable value T, which is represented as "Yes" as shown in FIG. 11B. In such a case, it proceeds to the offset calculation step (S117).

In the offset value calculation step (S117), the offset calculation unit 64 calculates a minimum natural number n' in the natural numbers n which satisfies the following equation (1). Here, pattern areas of the adjacent stripes S1 and S2 are respectively indicated as $s_1$ and $s_2$. Let $s_2 > s_1$. A set area difference, which is an area difference to be set for dividing a stripe, shall be t. The set area difference t is set to satisfy $0 < t \leq T$. In the example of FIG. 11A, since the pattern area of the stripe C is larger than that of the stripe B, $s_1 = b$ and $s_2 = c$.

Next, the offset calculation unit 64 calculates an offset value Δ. The offset value Δ is defined by the following equation (3).

$$\Delta = (\text{stripe latency time}) \cdot (n' - 1/(\text{number of shots in stripe})) \quad (3)$$

Writing processing is performed per stripe region. The "stripe latency time" described above indicates a stage movement time between stripe regions. In order to actually perform writing, the writing data processing unit 70 generates a shot figure by dividing each figure pattern assigned to each stripe region into the size that can be irradiated by one beam shot. For each stripe region, the shot number calculation unit 59 should calculate the number of shot figures arranged in a stripe region. As the "number of shots in stripe" of the equation (3), the number of shots of a stripe region whose total area of a pattern is larger than the other in the adjacent stripe regions 20 is used. What is necessary is to calculate the number of shots of each stripe region by the time when the offset value calculation step (S117) concerned is started to be executed.

In FIG. 15D, in the offset processing step (S119), the settling time setting unit 66 performs resetting by adding an offset value to the set settling time having already been set, for a stripe region whose pattern area is larger than that of the other in the adjacent stripe regions whose area difference t' (absolute value) exceeds the area difference acceptable value T.

In the determination step (S126), the determination unit 69 determines whether the determination step (S114) has been completed for all the stripe regions. If a stripe region for which the determination step (S114) has not been finished yet exists, it returns to the stripe setting step (S112). Steps from the stripe setting step (S112) to the determination step (S126) are repeated until the determination step (S114) has been completed for all the stripe regions.

In the writing step (S200), the writing unit 150 writes a pattern with the electron beam 200 such that the shot of a next beam may be deflected after the settling time, to which the offset value Δ has been added and which is longer than the settling time having been set, has passed with respect to a stripe region whose total pattern area is larger than that of the other in the adjacent stripe regions whose area difference t' (absolute value) exceeds the area difference acceptable value T. With respect to other stripe regions, a pattern is written with the electron beam 200 such that the shot of a next beam may be deflected after the settling time having been set has passed. The other contents of the writing step (S200) are the same as those of the first embodiment except for the writing order of stripe regions.

Although the case of calculating the area of a pattern for each stripe region is described in the above example, it is also preferable to calculate the number of shots used when writing a pattern assigned to the stripe region 20 concerned instead of calculating the area of a pattern, for each stripe region 20. In such a case, what is necessary is to read as follows in each step below in the respective steps of FIG. 14. The other contents are the same as those described above in the third embodiment.

In the case of using the number of shots instead of the area of a pattern, after the assignment processing step (S106), the writing data processing unit 70 generates a shot figure by dividing each figure pattern assigned to each stripe region into the size that can be irradiated by one beam shot in order to actually perform writing. When calculating the number of shots, what is necessary is just to read the area calculation step (S108) as the number of shots calculation step (S108). Then, the number of shots calculation unit 59 calculates the number of shots by calculating the number of shot figures arranged in a stripe region, for each stripe region.

In the determination step (S114), the determination unit 60 determines whether a difference between the number of shots of patterns of adjacent stripe regions 20 exceeds a corresponding threshold value or not. The area difference t' (absolute value) should be read as a shot number difference t' (absolute value). Moreover, the area difference acceptable value T should be read as a shot number difference acceptable value T. That is, the determination unit 60 determines whether the shot number difference t' (absolute value) of a pattern exceeds the shot number difference acceptable value T with respect to adjacent stripe regions 20.

As described above, according to the third embodiment, with respect to adjacent stripe regions whose difference concerning the total area or the number of shots of a pattern exceeds a corresponding threshold value, the settling time associated with writing one of the adjacent stripe regions whose total area or number of shots of a pattern is larger than the other one is extended.

Since the writing processing is performed per stripe region, it is possible, by extending the settling time, to lessen a change of the beam current amount which is applied to the target object 101 per unit time. Therefore, decrease of the accuracy of the writing position can be reduced or suppressed. Further, according to the third embodiment, the decrease of the throughput can be reduced compared with the case of uniformly extending the settling time for all the respective stripe regions. Thus, according to the third embodiment, decrease of the accuracy of the writing position at the place where a pattern density difference occurs in writing can be reduced or suppressed while reducing the decrease of the throughput.

Fourth Embodiment

According to the fourth embodiment, there will be described a configuration obtained by combining the first and second embodiments. In other words, after rearranging the writing order of a plurality of stripe regions to be the order of the pattern area (or the number of shots) in ascending order, re-division is performed for only a stripe region corresponding to the place where the area (or the number of shots) sharply changes (changing over an acceptable threshold value) between adjacent stripe regions.

Figure 16:
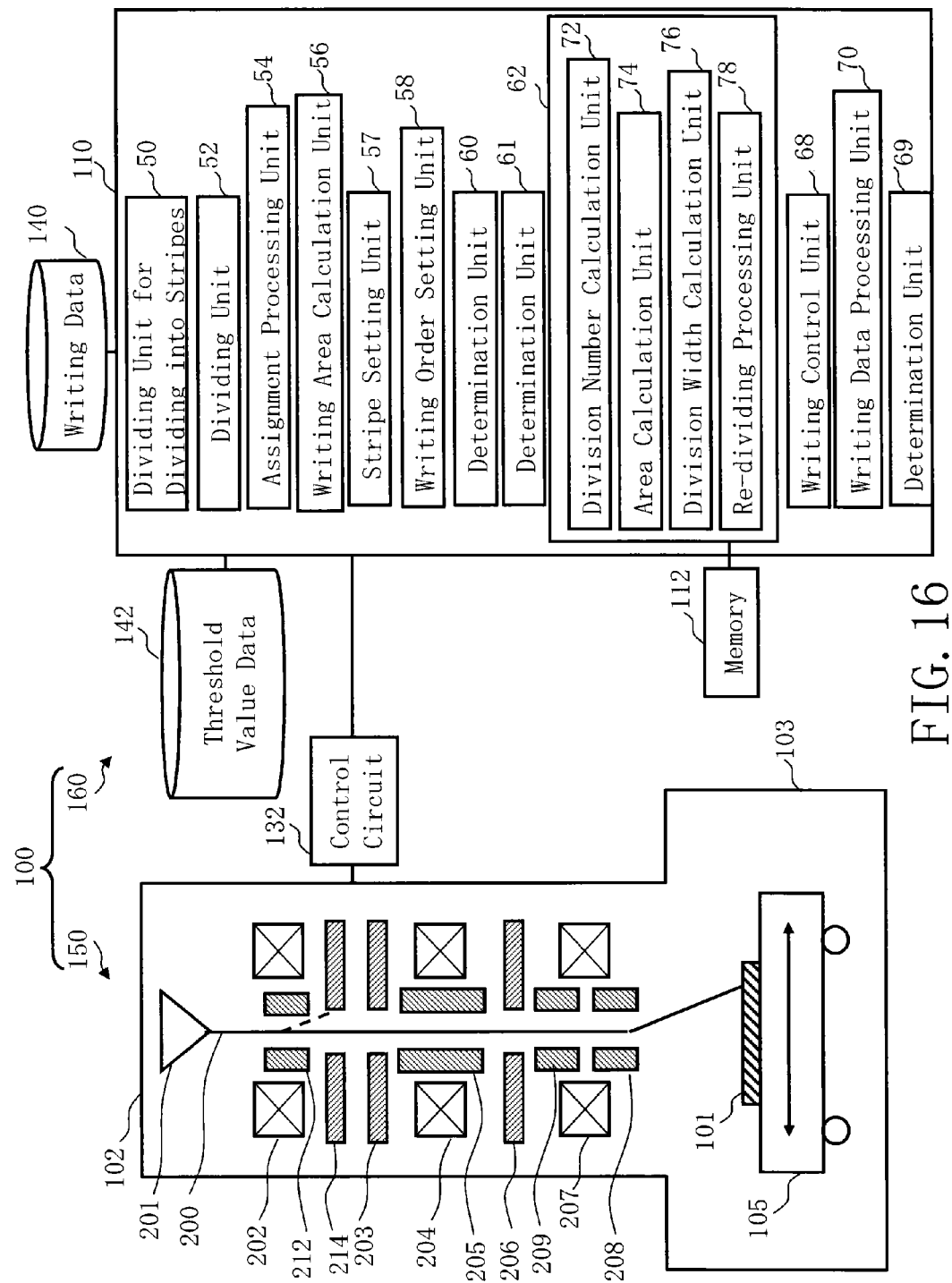
FIG. 16 is a schematic diagram showing the configuration of a writing apparatus according to the fourth embodiment.

FIG. 16 is a schematic diagram showing the configuration of a writing apparatus according to the fourth embodiment. FIG. 16 is the same as FIG. 8 except that the writing order setting unit 58 is arranged in the control computer 110.

Figure 17:
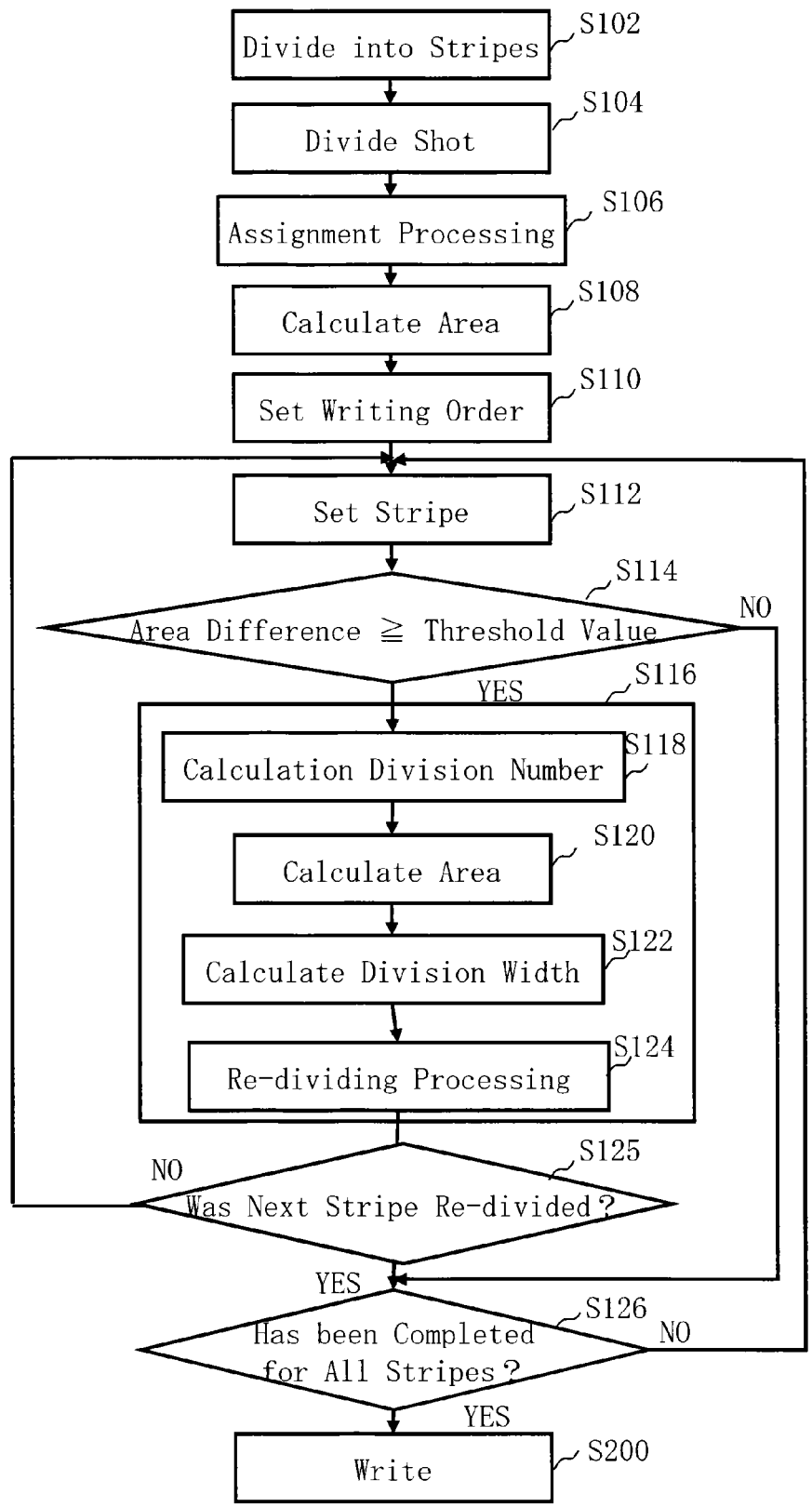
FIG. 17 is a flowchart showing main steps of a writing method according to the fourth embodiment.

FIG. 17 is a flowchart showing main steps of a writing method according to the fourth embodiment. FIG. 17 is the same as FIG. 9 except that the writing order setting step (S110) is added between the area calculation step (S108) and the stripe setting step (S112).

The contents of each step from the dividing step (S102) of dividing into stripes to the writing order setting step (S110) are the same as those of the first embodiment. The contents of each step from the stripe setting step (S112) to the determination step (S126) are the same as those of the second embodiment. The contents of the writing step (S200) are the same as those of the first or second embodiment.

FIGS. 18A to 18C are graphs showing an example of writing processing by rearrangement of a writing order and stripe re-division according to the fourth embodiment. In FIGS. 18A to 18C, the ordinate axis shows a writing area, and the abscissa axis shows a stripe. FIG. 18A shows that the position deviation becomes large (NG) at the place where the area sharply changes when the stripe regions are arranged such that a stripe region whose area is extremely small is located just after a stripe region whose area is extremely large. FIG. 18B shows the case in which the writing order is rearranged to be the order of the total pattern area in ascending order. However, even in such a case, there exists a stripe region whose area is extremely large compared with the other. Therefore, as shown in FIG. 18C, stripe re-division is performed. By performing the stripe re-division, the area difference between adjacent stripe regions can be lessened as shown in FIG. 18C. Accordingly, a sharp area change (pattern density change) can be suppressed. Therefore, the position deviation of a pattern to be written can be suppressed or reduced. Furthermore, since the increase of the number of stripe regions can be suppressed to be the least, decrease of the throughput can be suppressed.

In the fourth embodiment, it is also acceptable to use the number of shots as a determination target instead of the total area of a pattern similarly to the first or second embodiment. In such a case, word exchange reading is performed similarly to the first or second embodiment.

As described above, according to the fourth embodiment, a pattern is written after rearranging the writing order of a plurality of stripe regions to be the order of the total area or the number of shots of a pattern in ascending order. If there still remains a place where a difference concerning the total area or the number of shots of a pattern exceeds a corresponding threshold value with respect to adjacent stripe regions, re-division is performed for only a partial stripe region so that the difference concerning the total area or the number of shots of a pattern may not exceed the corresponding threshold value. Thereby, a similar effect to that of the first or second embodiment can be acquired. Furthermore, according to the fourth embodiment, since re-division of a stripe region is performed after rearranging the writing order per stripe region, the number of stripes which is increased by the re-division can be less than that of the second embodiment. Therefore, decrease of the throughput can be further reduced compared with the second embodiment. Thus, according to the fourth embodiment, decrease of the accuracy of the writing position at the place where a pattern density difference occurs in writing can be reduced or suppressed while reducing the decrease of the throughput.

Fifth Embodiment

According to the fifth embodiment, there will be described a configuration obtained by combining the first and third embodiments. In other words, after rearranging the writing order of a plurality of stripe regions to be the order of the pattern area (or the number of shots) in ascending order, the settling time is extended only for a stripe region corresponding to the place where the area (or the number of shots) sharply changes (changing over an acceptable threshold value) between adjacent stripe regions.

Figure 19:
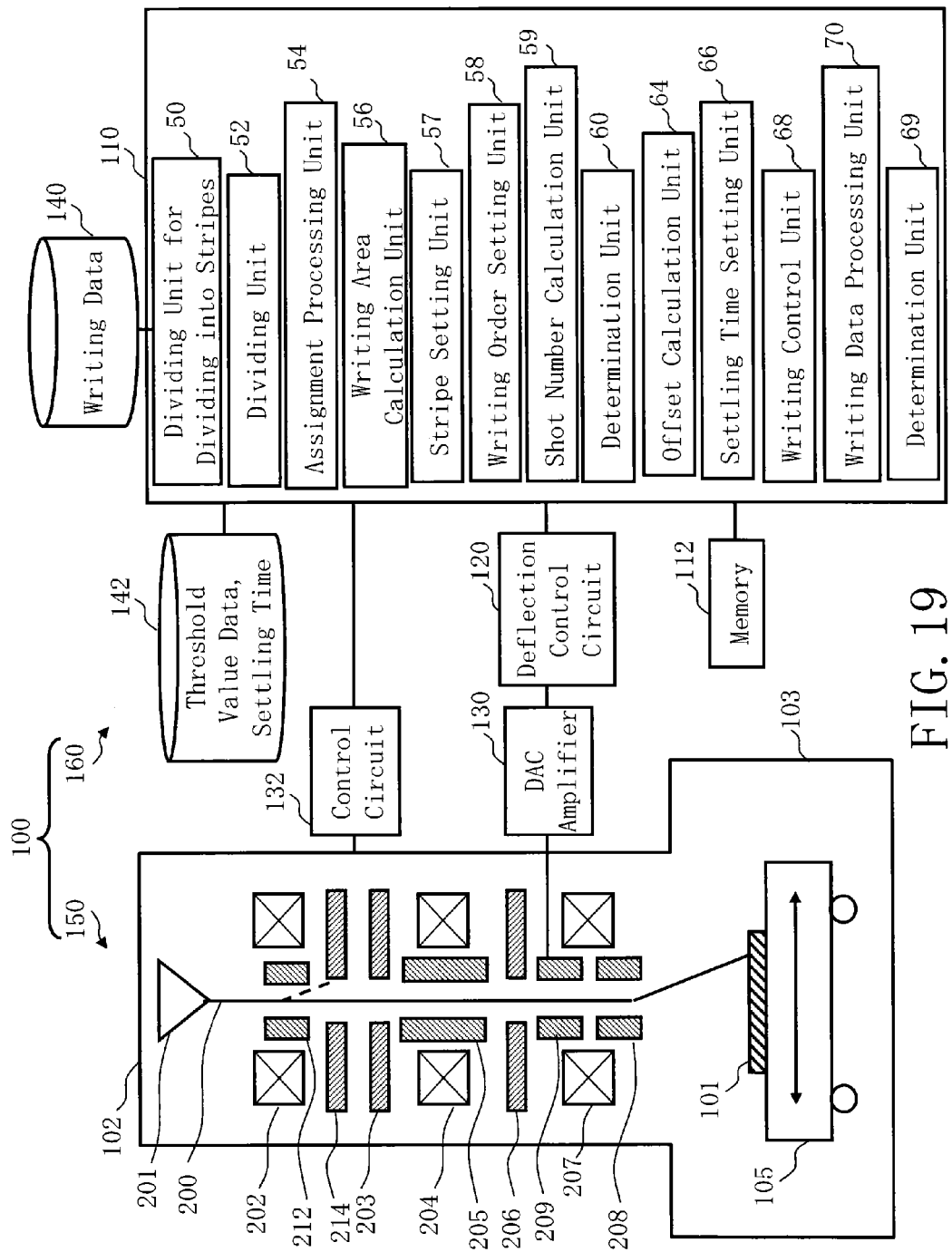
FIG. 19 is a schematic diagram showing the configuration of a writing apparatus according to the fifth embodiment.

FIG. 19 is a schematic diagram showing the configuration of a writing apparatus according to the fifth embodiment. FIG. 19 is the same as FIG. 13 except that the writing order setting unit 58 is arranged in the control computer 110.

Figure 20:
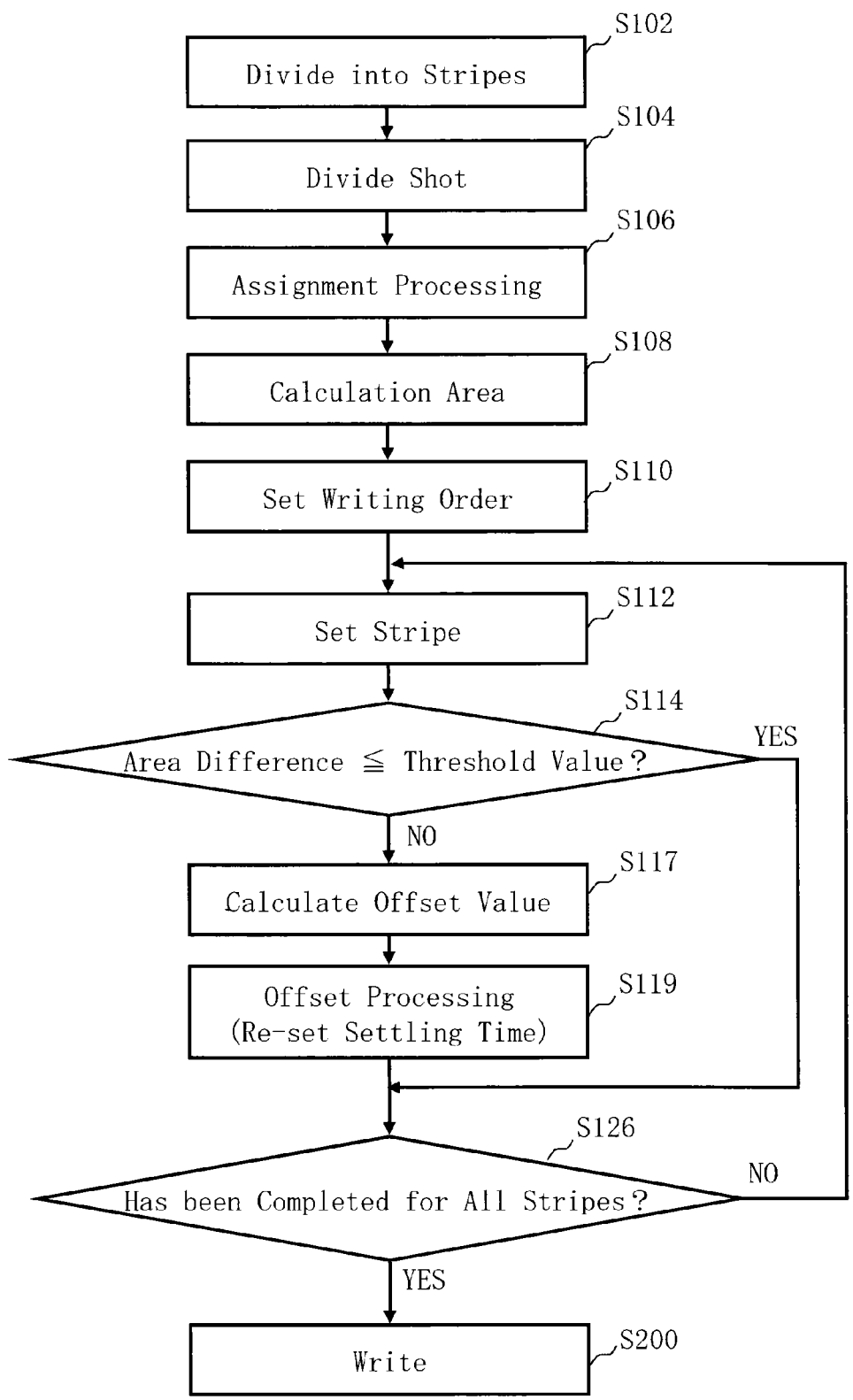
FIG. 20 is a flowchart showing main steps of a writing method according to the fifth embodiment.

FIG. 20 is a flowchart showing main steps of a writing method according to the fifth embodiment. FIG. 20 is the same as FIG. 14 except that the writing order setting step (S110) is added between the area calculation step (S108) and the stripe setting step (S112).

The contents of each step from the settling time setting step (S101) to the writing order setting step (S110) are the same as those of the first embodiment. The contents of each step from the stripe setting step (S112) to the determination step (S126) are the same as those of the third embodiment. The contents of the writing step (S200) are the same as those of the first or second embodiment.

Figure 21B:
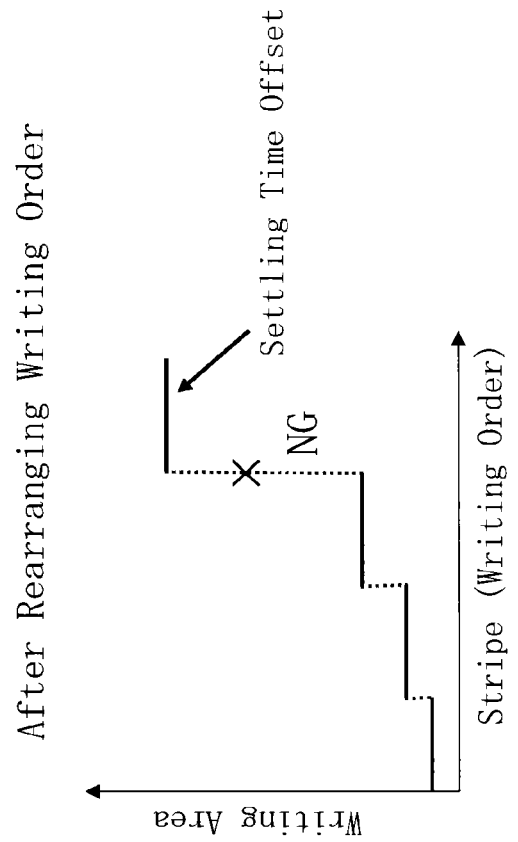
FIGS. 21A and 21B are graphs showing an example of writing processing by rearrangement of the writing order and stripe re-division according to the fifth embodiment.
Figure 21A:
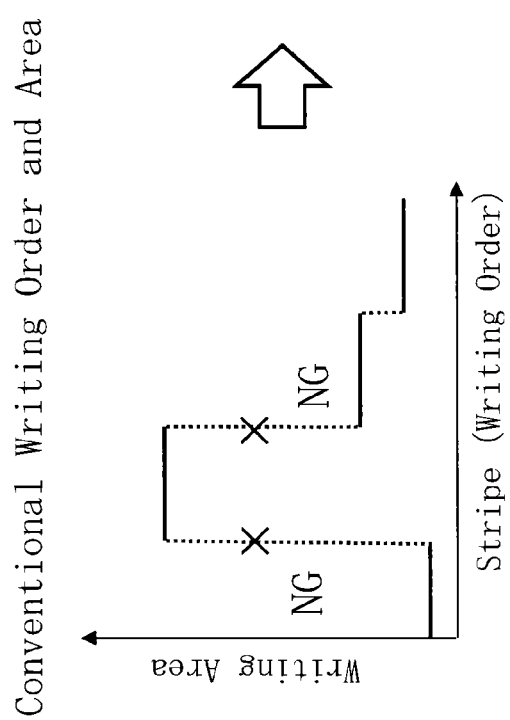
Figure 22:
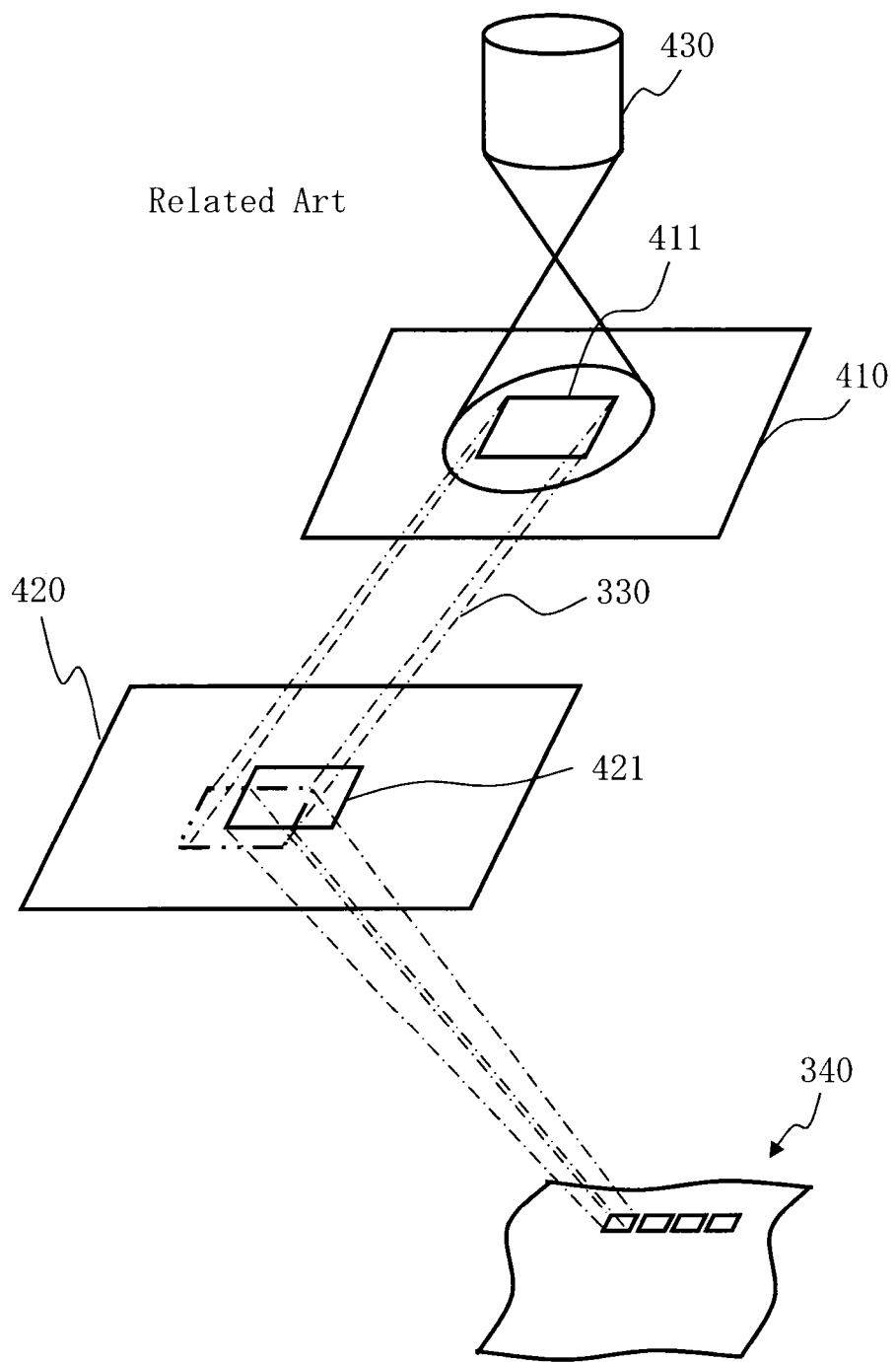
FIG. 22 is a conceptual diagram explaining operations of a variable shaping type electron beam writing apparatus.

FIGS. 21A and 21B are graphs showing an example of writing processing by rearrangement of the writing order and stripe re-division according to the fifth embodiment. In FIGS. 21A and 21B, the ordinate axis shows a writing area, and the abscissa axis shows a stripe. FIG. 21A shows that the position deviation becomes large (NG) at the place where the area sharply changes when the stripe regions are arranged such that a stripe region whose area is extremely small is located just after a stripe region whose area is extremely large. Then, FIG. 21B shows the case in which the writing order is rearranged to be the order of the total pattern area in ascending order. However, even in such as case, there exists a stripe region whose area is extremely large compared with the other. Therefore, with respect to adjacent stripe regions whose difference concerning a total area of a pattern exceeds a corresponding threshold value, the settling time associated with writing one of the adjacent stripe regions whose total area of a pattern is larger than the other one is extended. Accordingly, a change of the current amount of an irradiation beam per unit time can be lessened. Therefore, the position deviation of a pattern to be written can be suppressed or reduced. Furthermore, since the increase of the number of stripe regions can be suppressed to be the least, decrease of the throughput can be suppressed.

In the fifth embodiment, it is acceptable to use the number of shots as a determination target instead of the total area of a pattern similarly to the first or third embodiment. In such a case, word exchange reading is performed similarly to the first or third embodiment.

As described above, according to the fifth embodiment, a pattern is written after rearranging the writing order of a plurality of stripe regions to be the order of the total area or the number of shots of a pattern in ascending order. If there still remains a place where a difference concerning the total area or the number of shots of a pattern exceeds a corresponding threshold value with respect to adjacent stripe regions, the settling time for a stripe region whose total area or number of shots of a pattern is larger than the other one is extended. Thereby, a similar effect to that of the first or third embodiment can be acquired. Furthermore, according to the fifth embodiment, since the settling time is extended after rearranging the writing order per stripe region, the difference between adjacent stripes can be lessened. Therefore, the offset value for extending the settling time can be reduced. Accordingly, decrease of the throughput can be further reduced compared with the second embodiment. Thus, according to the fifth embodiment, decrease of the accuracy of the writing position at the place where a pattern density difference occurs in writing can be reduced or suppressed while reducing the decrease of the throughput.

The embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
virtually dividing a writing region of a target object into a plurality of strip-shaped stripe regions;
calculating one of a total area of a pattern assigned to a stripe region concerned and a number of shots of a charged particle beam for writing the pattern assigned to the stripe region concerned, for each stripe region of the plurality of stripe regions;
determining whether a difference between the one of the total area of the pattern and the number of shots with respect to one of adjacent stripe regions of the plurality of stripe regions and the one of the total area of the pattern and the number of shots with respect to an other of the adjacent stripe regions exceeds a corresponding threshold value;
re-dividing, in a case where the difference exceeds the corresponding threshold value as a result of the determining, a stripe region whose one of the total area of the pattern and the number of shots is larger than that of an other stripe region in the adjacent stripe regions so that the difference of the one of the total area of the pattern and the number of shots becomes lower than or equal to the corresponding threshold value; and
writing a pattern, with a charged particle beam, in the plurality of stripe regions including the stripe region having been re-divided, in a writing order of arrangement of the plurality of stripe regions.

2. The method according to claim 1, further comprising:
reading, before the determining, writing data from a storage device and dividing a figure pattern defined in the writing data, for the each stripe region of the plurality of stripe regions, based on region information on the each stripe region of the plurality of stripe regions.

3. The method according to claim 2, further comprising:
assigning, before the determining, each partial figure pattern obtained by the dividing the figure pattern, to a corresponding stripe region of the plurality of stripe regions.

4. The method according to claim 1, further comprising:
setting, before the determining, a stripe region to be a determination target in the plurality of stripe regions.

5. The method according to claim 4, further comprising:
setting a next stripe region to be a next determination target in a case where the difference does not exceed the corresponding threshold value as a result of the determining.

6. The method according to claim 1, wherein the re-dividing includes calculating a division number which is used for the re-dividing the stripe region whose the one of the total area of the pattern and the number of shots is larger than that of the other stripe region in the adjacent stripe regions.

7. The method according to claim 6, wherein the re-dividing includes calculating an area of each stripe region of a plurality of stripe regions obtained by the re-dividing.

8. The method according to claim 7, wherein the re-dividing includes calculating respective division widths for a plurality of the stripe regions to be obtained by the re-dividing such that pattern areas of the plurality of the stripe regions obtained by the re-dividing become larger in order.

9. The method according to claim 8, wherein the re-dividing includes dividing a stripe region serving as a re-dividing target by a corresponding division width of the respective division widths.

10. A charged particle beam writing method comprising:
virtually dividing a writing region of a target object into a plurality of strip-shaped stripe regions;
calculating one of a total area of a pattern assigned to a stripe region concerned and a number of shots of a charged particle beam for writing the pattern assigned to the stripe region concerned, for each stripe region of the plurality of stripe regions;
setting a writing order of the plurality of stripe regions to be an ascending order of the one of the total area of the pattern and the number of shots; and
writing a pattern with a charged particle beam in the plurality of stripe regions, in the ascending order of the one of the total area of the pattern and the number of shots.

11. The method according to claim 10, further comprising:
reading, before the setting the writing order, writing data from a storage device and dividing a figure pattern defined in the writing data, for the each stripe region of the plurality of stripe regions, based on region information on the each stripe region of the plurality of stripe regions.

12. The method according to claim 11, further comprising:
assigning, before the setting the writing order, each partial figure pattern obtained by the dividing the figure pattern, to a corresponding stripe region of the plurality of stripe regions.

13. A charged particle beam writing method comprising:
setting a settling time for a deflection amplifier of a deflector that deflects a charged particle beam onto a target object;
virtually dividing a writing region of a target object into a plurality of strip-shaped stripe regions;
calculating one of a total area of a pattern assigned to a stripe region concerned and a number of shots of a charged particle beam for writing the pattern assigned to the stripe region concerned, for each stripe region of the plurality of stripe regions;
determining whether a difference between the one of the total area of the pattern and the number of shots with respect to one of adjacent stripe regions of the plurality of stripe regions and the one of the total area of the pattern and the number of shots with respect to an other of adjacent stripe regions exceeds a corresponding threshold value; and
writing a pattern with a charged particle onto the plurality of stripe regions such that a shot of a next beam is deflected after a settling time longer than a settling time having been set has passed with respect to a stripe region whose one of the total area of the pattern and the number of shots is larger than that of an other stripe region in the adjacent stripe regions in which the difference exceeds the corresponding threshold value, and after the settling time having been set has passed with respect to other stripe regions different from the adjacent stripe regions.

14. The method according to claim 13, further comprising:
resetting the settling time having already been set by adding an offset value to the settling time having already been set, with respect to the stripe region whose one of the total area of the pattern and the number of shots is larger than that of the other stripe region in the adjacent stripe regions whose difference of the one of the total area and the number of shots exceeds the corresponding threshold.

15. The method according to claim 13, further comprising:
reading, before the determining, writing data from a storage device and dividing a figure pattern defined in the writing data, for the each stripe region of the plurality of stripe regions, based on region information on the each stripe region of the plurality of stripe regions.

16. The method according to claim 15, further comprising:
assigning, before the determining, each partial figure pattern obtained by the dividing the figure pattern, to a corresponding stripe region of the plurality of stripe regions.

17. A charged particle beam writing apparatus comprising:
a dividing unit configured to virtually divide a writing region of a target object into a plurality of strip-shaped stripe regions;
a calculation unit configured to calculate one of a total area of a pattern assigned to a stripe region concerned and a number of shots of a charged particle beam for writing the pattern assigned to the stripe region concerned, for each stripe region of the plurality of stripe regions;
a determination unit configured to perform determining whether a difference between the one of the total area of the pattern and the number of shots with respect to one of adjacent stripe regions of the plurality of stripe regions and the one of the total area of the pattern and the number of shots with respect to an other of adjacent stripe regions exceeds a corresponding threshold value;
a re-division unit configured, in a case where the difference exceeds the corresponding threshold value as a result of the determining, to re-divide a stripe region whose one of the total area of the pattern and the number of shots is larger than that of an other stripe region in the adjacent stripe regions so that the difference of the one of the total area of the pattern and the number of shots becomes lower than or equal to the corresponding threshold value; and
a writing unit configured to write a pattern, with a charged particle beam, in the plurality of stripe regions including the stripe region having been re-divided, in a writing order of arrangement of the plurality of stripe regions.

18. A charged particle beam writing apparatus comprising:
a dividing unit configured to virtually divide a writing region of a target object into a plurality of strip-shaped stripe regions;
a calculation unit configured to calculate one of a total area of a pattern assigned to a stripe region concerned and a number of shots of a charged particle beam for writing the pattern assigned to the stripe region concerned, for each stripe region of the plurality of stripe regions;
a setting unit configured to set a writing order of the plurality of stripe regions to be an ascending order of the one of the total area of the pattern and the number of shots; and
a writing unit configured to write a pattern with a charged particle beam in the plurality of stripe regions, in the ascending order of the one of the total area of the pattern and the number of shots.

* * * * *